(12) United States Patent
Ikenaga et al.

(10) Patent No.: US 9,543,461 B2
(45) Date of Patent: Jan. 10, 2017

(54) ENCAPSULATING MATERIAL FOR SOLAR CELL AND SOLAR CELL MODULE

(71) Applicant: Mitsui Chemicals Tohcello, Inc., Chiyoda-ku (JP)

(72) Inventors: Shigenobu Ikenaga, Chiba (JP); Fumito Takeuchi, Chiba (JP); Tomoaki Ito, Ichihara (JP)

(73) Assignee: MITSUI CHEMICALS, INC., Tokyo (JP)

( * ) Notice: Subject to any disclaimer, the term of this patent is extended or adjusted under 35 U.S.C. 154(b) by 0 days.

(21) Appl. No.: 14/378,462

(22) PCT Filed: Feb. 7, 2013

(86) PCT No.: PCT/JP2013/000662
§ 371 (c)(1),
(2) Date: Aug. 13, 2014

(87) PCT Pub. No.: WO2013/121746
PCT Pub. Date: Aug. 22, 2013

(65) Prior Publication Data
US 2015/0007883 A1 Jan. 8, 2015

(30) Foreign Application Priority Data

Feb. 14, 2012 (JP) ................................. 2012-029619

(51) Int. Cl.
*C08L 23/16* (2006.01)
*H01L 31/048* (2014.01)
(Continued)

(52) U.S. Cl.
CPC .............. *H01L 31/0481* (2013.01); *C08K 5/00* (2013.01); *C09D 123/0815* (2013.01);
(Continued)

(58) Field of Classification Search
CPC ....... C08L 23/08; C08L 23/16; C08L 23/0815; C08L 2203/06; C08L 2203/04; C08K 5/13; C08K 5/49; C08K 5/17; H01L 31/04; H01L 31/042
(Continued)

(56) References Cited

U.S. PATENT DOCUMENTS 6,093,757 A * 7/2000 Pern .................. B32B 17/10678
 136/251
6,610,765 B1 * 8/2003 Pfaendner et al. ........... 524/108
(Continued)

FOREIGN PATENT DOCUMENTS

EP 1 820 821 A1 8/2007
JP 11-026791 A 1/1999
(Continued)

OTHER PUBLICATIONS

International Search Report (PCT/ISA/210) mailed on Mar. 12, 2013, by the Japanese Patent Office as the International Searching Authority for International Application No. PCT/JP2013/000662.
(Continued)

*Primary Examiner* — Rip A Lee
(74) *Attorney, Agent, or Firm* — Buchanan, Ingersoll & Rooney PC

(57) ABSTRACT

An encapsulating material for solar cell that is capable of suppressing the corrosion of metal and the occurrence of yellowing at a high temperature and has excellent long-term reliability in a constant temperature and humidity is provided.
The encapsulating material for solar cell of the invention contains an ethylene/α-olefin copolymer, a hindered amine-based light stabilizer, a hindered phenol-based stabilizer, and a phosphorous-based stabilizer as essential components.

11 Claims, 1 Drawing Sheet

(51) Int. Cl.
*C09D 123/08* (2006.01)
*C08K 5/00* (2006.01)
C08K 5/3435 (2006.01)
C08K 5/134 (2006.01)
C08K 5/526 (2006.01)
C08K 5/529 (2006.01)

(52) U.S. Cl.
CPC .......... *C08K 5/1345* (2013.01); *C08K 5/3435* (2013.01); *C08K 5/526* (2013.01); *C08K 5/529* (2013.01); *C08L 2203/204* (2013.01); *Y02B 10/12* (2013.01); *Y02E 10/50* (2013.01)

(58) Field of Classification Search
USPC ........ 524/115, 323, 351, 349, 236, 540, 585
See application file for complete search history.

(56) References Cited

U.S. PATENT DOCUMENTS

| | | | |
|---|---|---|---|
| 6,719,941 B1 * | 4/2004 | Frohaug et al. | 264/310 |
| 6,953,831 B2 * | 10/2005 | Ishihama et al. | 526/352 |
| 7,259,198 B2 * | 8/2007 | Vaillant | 524/99 |
| 8,053,086 B2 * | 11/2011 | Nishijima | B32B 17/10018 |
| | | | 136/251 |
| 8,697,984 B2 * | 4/2014 | Amamiya et al. | 136/251 |
| 8,772,625 B2 * | 7/2014 | Ikenaga et al. | 136/251 |
| 8,945,701 B2 * | 2/2015 | Ikenaga | C08F 255/02 |
| | | | 136/251 |
| 9,040,811 B2 * | 5/2015 | Ikenaga | H01L 31/0481 |
| | | | 136/251 |
| 2009/0165847 A1 | 7/2009 | Mori et al. | |
| 2012/0073631 A1 * | 3/2012 | Ikenaga | C08F 255/02 |
| | | | 136/251 |
| 2013/0118584 A1 | 5/2013 | Taniguchi et al. | |
| 2013/0213471 A1 * | 8/2013 | Ikenaga | C08F 210/16 |
| | | | 136/256 |
| 2013/0233376 A1 * | 9/2013 | Ikenaga | H01L 31/0481 |
| | | | 136/251 |

FOREIGN PATENT DOCUMENTS

| | | | | |
|---|---|---|---|---|
| JP | 2011-108802 A | 6/2011 | | |
| JP | 2011-155239 A | 8/2011 | | |
| JP | 2011-228454 A | 11/2011 | | |
| JP | 2012-9761 A | 1/2012 | | |
| JP | 2012-15402 A | 1/2012 | | |
| JP | 2012-19001 A | 1/2012 | | |
| KR | 10-2008-0078852 A | 8/2008 | | |
| WO | WO 2012/014965 A1 | 0/2012 | | |
| WO | WO 2006/057361 A1 | 6/2006 | | |
| WO | WO 2010/114028 A1 * | 10/2010 | ........... | H01L 31/042 |
| WO | WO 2012/046456 A1 * | 4/2012 | ........... | H01L 31/042 |
| WO | WO 2012/060086 A1 * | 5/2012 | ........... | H01L 31/042 |
| WO | WO 2012/066783 A1 * | 5/2012 | ........... | H01L 31/042 |

OTHER PUBLICATIONS

Office Action issued by the Korean Patent Office in corresponding Korean Patent Application on Oct. 14, 2015 (11 pages).
Opposition filed on Aug. 9, 2016 in the corresponding Japanese Application (58 pages).
Office Action issued by the Taiwanese Patent Office in corresponding Taiwanese Patent Application No. 10520984810 on Aug. 9, 2016 (7 pages).

\* cited by examiner

ENCAPSULATING MATERIAL FOR SOLAR CELL AND SOLAR CELL MODULE

TECHNICAL FIELD

The present invention relates to an encapsulating material for solar cell and a solar cell module.

BACKGROUND ART

In response to the increasing seriousness of global environmental issues, energy issues, and the like, a solar cell is attracting attention as clean energy-generating means with no concern over depletion. In a case in which a solar cell is used outdoors such as on the roof of a building, it is usual to use the solar cell in a solar cell module form.

Generally, the solar cell module is manufactured in the following order. First, a crystalline solar cell element (hereinafter also referred to as a power generation element or a cell) formed of polycrystalline silicon or monocrystalline silicon, or a thin film-type solar cell element obtained by forming an extremely thin (several micrometers) film of amorphous silicon or crystal silicon on a glass substrate or the like is manufactured.

Next, to obtain a crystalline solar cell module, a protective sheet (a transparent surface protective member) for the solar cell module, an encapsulating material for solar cell, the crystalline solar cell element, an encapsulating material for solar cell, and a protective sheet (a back surface protective member) for the solar cell module are sequentially laminated.

Meanwhile, to obtain a thin film-based solar cell module, a thin film-type solar cell element, an encapsulating material for solar cell, and a protective sheet (a back surface protective member) for the solar cell module are sequentially laminated. After that, the solar cell module is manufactured using a lamination method or the like in which the above-described laminate is suctioned in a vacuum, heated and pressed. The solar cell module manufactured in the above-described manner is weather resistant and is also suitable for outdoor use such as on the roof of a building.

An ethylene/vinyl acetate copolymer (EVA) film is widely used as an encapsulating material for solar cell due to its excellent transparency, flexibility, adhesiveness, and the like. However, in a case in which an EVA composition was used as a constituent material for an encapsulating material for solar cell, there was a concern over the possibility of a component being generated by the decomposition of EVA such as acetic acid gas affecting a solar cell element.

In contrast to the ethylene/vinyl acetate copolymer film, a resin composition for an encapsulating material for solar cell has been proposed which is composed of an ethylene/α-olefin copolymer, an organic peroxide, and a phenol-based antioxidant (for example, refer to Patent Document 1). The resin composition for an encapsulating material for solar cell has favorable productivity, does not corrode metal, and is excellent in terms of heat resistance, light transmittance, transparency, and adhesiveness to a substrate of a transparent surface protective member.

In addition, a resin composition for an encapsulating material for solar cell has been proposed which is composed of an ethylene/α-olefin copolymer, and an antioxidant having a phosphite ester structure and a phenol structure in the same molecule (for example, refer to Patent Document 2). The resin composition for an encapsulating material for solar cell is excellent in terms of heat stability, oxidization stability, and hue stability during a molding process and is improved in terms of the generation and attachment of gum at the nozzle outlet of an extruder.

RELATED DOCUMENT

Patent Document

[Patent Document 1] Japanese Unexamined Patent Publication No. 2011-155239
[Patent Document 2] Japanese Unexamined Patent Publication No. 2012-9761

DISCLOSURE OF THE INVENTION

However, the present inventors found that the resin composition for an encapsulating material for solar cell described in Patent Document 1 is capable of suppressing the corrosion of metal and the occurrence of yellowing, but has insufficient long-term reliability in a constant temperature and humidity. In addition, in the resin composition for an encapsulating material for solar cell described in Patent Document 2, there was a tendency that a gel-form foreign substance was generated in a sheet during a molding process. In addition, there was another tendency that yellowing occurred at a high temperature.

Therefore, an object of the invention is to provide an encapsulating material for solar cell that is capable of suppressing the corrosion of metal and the occurrence of yellowing at a high temperature and has excellent long-term reliability in a constant temperature and humidity.

The inventors repeated intensive studies regarding the long-term reliability in a constant temperature and humidity. As a result, the inventors found that, when a hindered phenol-based stabilizer and a phosphorous-based stabilizer are added to an encapsulating material for solar cell containing an ethylene/α-olefin copolymer and a hindered amine-based light stabilizer at the same time as heat-resistant stabilizers, it is possible to obtain an encapsulating material for solar cell which is capable of suppressing the corrosion of metal and the occurrence of yellowing at a high temperature, and has excellent long-term reliability in a constant temperature and humidity, and completed the invention.

That is, according to the invention, encapsulating materials for solar cell described below are provided.

[1] An encapsulating material for solar cell containing an ethylene/α-olefin copolymer, a hindered amine-based light stabilizer, a hindered phenol-based stabilizer, and a phosphorous-based stabilizer.

[2] The encapsulating material for solar cell according to the above [1], in which a content of the hindered phenol-based stabilizer in the encapsulating material for solar cell is in a range of 0.005 parts by weight to 0.1 parts by weight with respect to 100 parts by weight of the ethylene/α-olefin copolymer.

[3] The encapsulating material for solar cell according to the above [1] or [2], in which a content of the phosphorous-based stabilizer in the encapsulating material for solar cell is in a range of 0.005 parts by weight to 0.5 parts by weight with respect to 100 parts by weight of the ethylene/α-olefin copolymer.

[4] The encapsulating material for solar cell according to any one of the above [1] to [3], in which a content of the hindered amine-based light stabilizer in the encapsulating material for solar cell is in a range of 0.01 parts by weight to 2.0 parts by weight with respect to 100 parts by weight of the ethylene/α-olefin copolymer.

[5] The encapsulating material for solar cell according to any one of the above [1] to [4], further containing an organic peroxide.

[6] The encapsulating material for solar cell according to the above [5], in which a one-minute half-life temperature of the organic peroxide is in a range of 100° C. to 170° C., and a content of the organic peroxide in the encapsulating material for solar cell is in a range of 0.1 parts by weight to 3 parts by weight with respect to 100 parts by weight of the ethylene/α-olefin copolymer.

[7] The encapsulating material for solar cell according to any one of the above [1] to [6], in which the ethylene/α-olefin copolymer satisfies the following requirements a1) to a4):

a1) a content ratio of a structural unit derived from ethylene is in a range of 80 mol % to 90 mol %, and a content ratio of a structural unit derived from an α-olefin having 3 to 20 carbon atoms is in a range of 10 mol % to 20 mol %;

a2) MFR, which is based on ASTM D1238 and measured under conditions of a temperature of 190° C. and a load of 2.16 kg, is in a range of 0.1 g/10 minutes to 50 g/10 minutes;

a3) a density, which is measured on the basis of ASTM D1505, is in a range of 0.865 g/cm$^3$ to 0.884 g/cm$^3$; and a4) a shore A hardness, which is measured on the basis of ASTM D2240, is in a range of 60 to 85.

[8] The encapsulating material for solar cell according to the above [7], in which MFR of the ethylene/α-olefin copolymer, which is based on ASTM D1238 and measured under conditions of a temperature of 190° C. and a load of 2.16 kg, is in a range of 10 g/10 minutes to 50 g/10 minutes.

[9] The encapsulating material for solar cell according to any one of the above [1] to [8], further containing a silane coupling agent, in which a content of the silane coupling agent in the encapsulating material for solar cell is in a range of 0.1 parts by weight to 5 parts by weight with respect to 100 parts by weight of the ethylene/α-olefin copolymer.

[10] The encapsulating material for solar cell according to any one of the above [1] to [9], further containing an ultraviolet absorber, in which a content of the ultraviolet absorber in the encapsulating material for solar cell is in a range of 0.005 parts by weight to 5 parts by weight with respect to 100 parts by weight of the ethylene/α-olefin copolymer.

[11] The encapsulating material for solar cell according to any one of the above [1] to [10], further containing a crosslinking aid, in which a content of the crosslinking aid in the encapsulating material for solar cell is in a range of 0.05 parts by weight to 5 parts by weight with respect to 100 parts by weight of the ethylene/α-olefin copolymer.

[12] The encapsulating material for solar cell according to any one of the above [1] to [11] obtained by melting and kneading the ethylene/α-olefin copolymer, the hindered amine-based light stabilizer, the hindered phenol-based stabilizer, and the phosphorous-based stabilizer, and then molding by extrusion the mixture into a sheet shape.

[13] The encapsulating material for solar cell according to any one of the above [1] to [12] having a sheet shape.

[14] A solar cell module including:
a transparent surface protective member,
a back surface protective member,
a solar cell element, and
an encapsulating layer which is formed by crosslinking the encapsulating material for solar cell according to any one of the above [1] to [13] and encapsulates the solar cell element between the transparent surface protective member and the back surface protective member.

According to the invention, it is possible to provide an encapsulating material for solar cell that is capable of suppressing the corrosion of metal and the occurrence of yellowing at a high temperature and has excellent long-term reliability in a constant temperature and humidity.

According to the invention, when the above-described encapsulating material for solar cell is used, in addition to the excellent balance among a variety of the above-described characteristics, even when the temperature increases during the use of a solar cell module, it is possible to avoid a trouble such as the deformation of the encapsulating material. In addition, it is possible to provide a solar cell module that does not impair the appearance of a solar cell and is excellent in terms of economic aspects such as costs.

BRIEF DESCRIPTION OF THE DRAWINGS

The above-described object, other objects, characteristics, and advantages will be further clarified using preferable embodiments described below and the following drawings accompanied by the embodiments.

DESCRIPTION OF EMBODIMENTS

Figure 1:
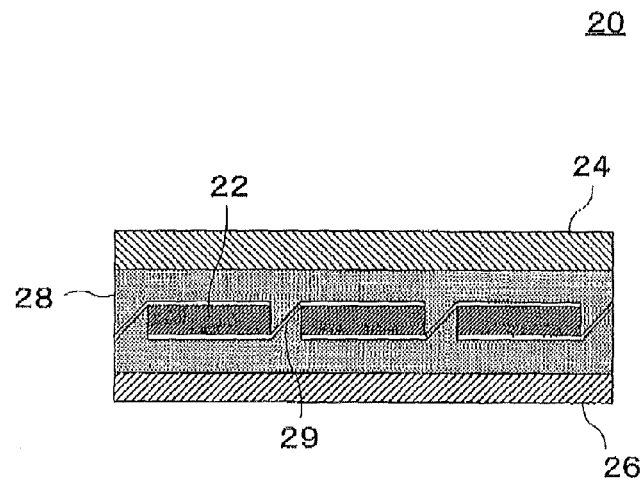
FIG. 1 is a cross-sectional view schematically illustrating an embodiment of a solar cell module of the invention.

Hereinafter, the embodiments of the invention will be described using the drawings. Further, in all the drawings, the same components will be given the same reference numerals and will not be described again as appropriate. In addition, "A to B" indicates "equal to or more than A and equal to or less than B" unless particularly otherwise described.

1. With Regard to an Encapsulating Material for Solar Cell

An encapsulating material for solar cell of the invention contains an ethylene/α-olefin copolymer, a hindered amine-based light stabilizer, a hindered phenol-based stabilizer, and a phosphorous-based stabilizer as essential components.

The inventors repeated intensive studies regarding the long-term reliability in a constant temperature and humidity while changing the composition of a resin composition. As a result, it was found that a decrease in the content of the hindered phenol-based stabilizer improves the long-term reliability in a constant temperature and humidity. However, while the long-term reliability in a constant temperature and humidity is improved, yellowing occurs at a high temperature.

Based on what has been described above, the inventors clarified that there is a trade-off relationship between the suppression of yellowing at a high temperature and the long-term reliability in a constant temperature and humidity in an encapsulating material for solar cell of the related art.

Therefore, as a result of additional intensive studies, the inventors found that, when a phosphorous-based stabilizer which has not been generally used as a heat-resistant stabilizer for an encapsulating material for solar cell due to its property that corrodes metal is jointly used with a hindered phenol-based stabilizer at the same time, the corrosion of metal is suppressed, and the trade-off relationship can be improved.

(Ethylene/α-Olefin Copolymer)

The ethylene/α-olefin copolymer used in the encapsulating material for solar cell of the invention is obtained by copolymerizing ethylene and an α-olefin having 3 to 20 carbon atoms. As the α-olefin, generally, it is possible to solely use an α-olefin having 3 to 20 carbon atoms, or to use a combination of two α-olefins having 3 to 20 carbon atoms. Examples of the α-olefin having 3 to 20 carbon atoms include straight-chain or branched α-olefins such as propylene, 1-butene, 1-pentene, 1-hexene, 3-methyl-1-butene, 3,3-dimethyl-1-butene, 4-methyl-1-pentene, 1-octene, 1-decene, and 1-dodecene. Among the above-described α-olefins, an α-olefin having 10 or less carbon atoms is preferred, and an α-olefin having 3 to 8 carbon atoms is particularly preferred. Propylene, 1-butene, 1-pentene, 1-hexene, 4-methyl-1-pentene, and 1-octene are preferred in terms of easy procurement. Meanwhile, the ethylene/α-olefin copolymer may be a random copolymer or a block copolymer, but is preferably a random copolymer from the viewpoint of flexibility.

Furthermore, the ethylene/α-olefin copolymer used in the encapsulating material for solar cell of the present embodiment may be a copolymer composed of ethylene, an α-olefin having 3 to 20 carbon atoms and a unconjugated polyene. The α-olefin is the same as described above, and examples of the unconjugated polyene include 5-ethylidene-2-norbornene (ENB), 5-vinyl-2-norbornene (VNB), dicyclopentadiene (DCPD), and the like. The unconjugated polyene can be solely used, or a combination of two or more unconjugated polyene can be used.

The ethylene/α-olefin copolymer used in the encapsulating material for solar cell of the embodiment may be jointly used with an aromatic vinyl compound, and examples of the aromatic vinyl compound include styrenes such as styrene, o-methyl styrene, m-methyl styrene, p-methyl styrene, o,p-dimethyl styrene, methoxy styrene, vinylbenzoic acid, methyl vinylbenzoate, vinylbenzyl acetate, hydroxystyrene, p-chlorostyrene, and divinylbenzene; 3-phenyl propylene, 4-phenyl propylene, α-methyl styrene, and cyclic olefins having 3 to 20 carbon atoms such as cyclopentene, cycloheptene, norbornene, and 5-methyl-2-norbornene.

The encapsulating material for solar cell of the embodiment preferably satisfies the following requirements a1 to a4.

(Requirement a1)

The content ratio of a structural unit, which is contained in the ethylene/α-olefin copolymer and is derived from ethylene, is preferably in a range of 80 mol % to 90 mol %, more preferably in a range of 80 mol % to 88 mol %, still more preferably in a range of 82 mol % to 88 mol %, and particularly preferably in a range of 82 mol % to 87 mol %. The content ratio of a structural unit, which is contained in the ethylene/α-olefin copolymer and is derived from the α-olefin having 3 to 20 carbon atoms (hereinafter, also referred to as "α-olefin unit"), is preferably in a range of 10 mol % to 20 mol %, more preferably in a range of 12 mol % to 20 mol %, still more preferably in a range of 12 mol % to 18 mol %, and particularly preferably in a range of 13 mol % to 18 mol %.

When the content ratio of the α-olefin unit contained in the ethylene/α-olefin copolymer is set to equal to or more than 10 mol %, high transparency can be obtained. In addition, it is possible to easily carry out extrusion-molding at a low temperature, for example, extrusion-molding at 130° C. or lower is possible. Therefore, even in a case in which the organic peroxide is forcibly inserted into the ethylene/α-olefin copolymer, it is possible to suppress the progress of a crosslinking reaction in an extruder, and to prevent the generation of a gel-form foreign substance in a sheet of the encapsulating material for solar cell and the deterioration of the appearance of the sheet. In addition, since appropriate flexibility can be obtained, it is possible to prevent the occurrence of cracking in the solar cell element or the chipping of the thin film electrode during the lamination molding of the solar cell module.

When the content ratio of the α-olefin unit contained in the ethylene/α-olefin copolymer is set to equal to or less than 20 mol %, the crystallization rate of the ethylene/α-olefin copolymer becomes appropriate, and therefore a sheet extruded from an extruder does not become sticky, the sheet is easily peeled from a cooling roll, and it is possible to efficiently obtain a sheet-shaped sheet of the encapsulating material for solar cell. In addition, since the sheet does not become sticky, blocking can be prevented, and the feeding property of the sheet is favorable. In addition, it is also possible to prevent the degradation of the heat resistance.

(Requirement a2)

The melt flow rate (MFR) of the ethylene/α-olefin copolymer, which is based on ASTM D1238 and measured under conditions of 190° C. and a load of 2.16 kg, is generally in a range of 0.1 g/10 minutes to 50 g/10 minutes, preferably in a range of 2 g/10 minutes to 50 g/10 minutes, more preferably in a range of 10 g/10 minutes to 50 g/10 minutes, still more preferably in a range of 10 g/10 minutes to 40 g/10 minutes, particularly preferably in a range of 12 g/10 minutes to 27 g/10 minutes, and most preferably in a range of 15 g/10 minutes to 25 g/10 minutes. MFR of the ethylene/α-olefin copolymer can be adjusted by adjusting the polymerization temperature and the polymerization pressure during a polymerization reaction described below, the molar ratio between the monomer concentration and the hydrogen concentration in ethylene and the α-olefin in a polymerization system, and the like.

When MFR is in a range of 0.1 g/10 minutes to 10 g/10 minutes, it is possible to manufacture a sheet through calendar molding. When MFR is in a range of 0.1 g/10 minutes to 10 g/10 minutes, the fluidity of the resin composition containing the ethylene/α-olefin copolymer is low, and therefore it is possible to prevent a lamination apparatus from being contaminated by the molten resin extracted when the sheet is laminated with the cell element, which is preferable.

Furthermore, when MFR is equal to or more than 2 g/10 minutes, the fluidity of the encapsulating material for solar cell improves, and it is also possible to produce the encapsulating material through sheet extrusion molding. Furthermore, when MFR is equal to or more than 10 g/10 minutes, in a case in which a sheet is manufactured through extrusion molding, the fluidity of the resin composition containing the ethylene/α-olefin copolymer is improved, and it is possible to improve the productivity during sheet extrusion molding.

In addition, when MFR is set to equal to or less than 50 g/10 minutes, the molecular weight is increased so that it is possible to suppress the adhesion to a roll surface of a chilled roll or the like, and therefore peeling is not required, and a sheet having a uniform thickness can be molded. Furthermore, since the resin composition becomes "stiff", it is possible to easily mold a sheet having a thickness of equal to or more than 0.3 mm. In addition, since the crosslinking characteristic is improved during the lamination molding of the solar cell module, the crosslinkable resin is sufficiently crosslinked so that the degradation of the heat resistance can be suppressed. When MFR is equal to or less than 27 g/10 minutes, furthermore, it is possible to suppress drawdown during the sheet molding, and thus it is possible to mold a sheet having a wide width, to further improve the crosslinking characteristic and the heat resistance, and to obtain the most favorable sheet of the encapsulating material for solar cell.

(Requirement a3)

The density of the ethylene/α-olefin copolymer, which is measured on the basis of ASTM D1505, is preferably in a range of 0.865 g/cm$^3$ to 0.884 g/cm$^3$, more preferably in a range of 0.866 g/cm$^3$ to 0.883 g/cm$^3$, still more preferably in a range of 0.866 g/cm$^3$ to 0.880 g/cm$^3$, and particularly preferably in a range of 0.867 g/cm$^3$ to 0.880 g/cm$^3$. The density of the ethylene/α-olefin copolymer can be adjusted using the balance between the content ratio of the ethylene unit and the content ratio of the α-olefin unit. That is, when the content ratio of the ethylene unit is increased, the crystallinity increases, and the ethylene/α-olefin copolymer having a high density can be obtained. On the other hand, when the content ratio of the ethylene unit is decreased, the crystallinity decreases, and the ethylene/α-olefin copolymer having a low density can be obtained.

When the density of the ethylene/α-olefin copolymer is equal to or less than 0.884 g/cm$^3$, the crystallinity becomes low, and it is possible to increase the transparency. Furthermore, extrusion-molding at a low temperature becomes easy, and, for example, it is possible to carry out extrusion-molding at 130° C. or lower. Therefore, even when the organic peroxide is forcibly inserted into the ethylene/α-olefin copolymer, it is possible to prevent the progress of a crosslinking reaction in an extruder, to suppress the generation of a gel-form foreign substance in the sheet of the encapsulating material for solar cell, and to suppress the deterioration of the appearance of the sheet. In addition, since the flexibility is high, it is possible to prevent the occurrence of cracking in a cell which is a solar cell element or the chipping of the thin film electrode during the lamination molding of the solar cell module.

On the other hand, when the density of the ethylene/α-olefin copolymer is equal to or more than 0.865 g/cm$^3$, it is possible to increase the crystallization rate of the ethylene/α-olefin copolymer, and therefore a sheet extruded from an extruder does not become sticky, the sheet is easily peeled from a cooling roll, and it is possible to easily obtain a sheet of the encapsulating material for solar cell. In addition, since the sheet does not become sticky, it is possible to suppress the occurrence of blocking and improve the feeding property of the sheet. In addition, since the sheet is sufficiently crosslinked, it is possible to suppress the degradation of the heat resistance.

(Requirement a4)

The shore A hardness of the ethylene/α-olefin copolymer, which is measured on the basis of ASTM D2240, is preferably in a range of 60 to 85, more preferably in a range of 62 to 83, still more preferably in a range of 62 to 80, and particularly preferably in a range of 65 to 80. The shore A hardness of the ethylene/α-olefin copolymer can be adjusted by adjusting the content ratio or density of the ethylene unit in the ethylene/α-olefin copolymer within the above-described numeric range. That is, the shore A hardness becomes great in the ethylene/α-olefin copolymer having a high content ratio and a high density of the ethylene unit. On the other hand, the shore A hardness becomes low in the ethylene/α-olefin copolymer having a low content ratio of the ethylene unit and a low density.

When the shore A hardness is equal to or more than 60, the ethylene/α-olefin copolymer does not easily become sticky, and is capable of suppressing blocking. In addition, it is also possible to improve the feeding property of the sheet when the encapsulating material for solar cell is processed in a sheet shape, and it is also possible to suppress a decrease in the heat resistance.

On the other hand, when the shore A hardness is equal to or less than 85, the crystallinity becomes low, and it is possible to increase the transparency. Furthermore, since the flexibility is high, it is possible to prevent the occurrence of cracking in a cell which is the solar cell element or the chipping of the thin film electrode during the lamination molding of the solar cell module.

Furthermore, the encapsulating material for solar cell of the embodiment preferably further satisfies the following requirements.

(Melting Peak)

The differential scanning calorimetry (DSC)-based melting peak of the ethylene/α-olefin copolymer is preferably in a range of 30° C. to 90° C., more preferably in a range of 33° C. to 90° C., and particularly preferably in a range of 33° C. to 88° C. When the melting peak is 90° C. or lower, the degree of crystallinity becomes low, and the flexibility of the obtained encapsulating material for solar cell becomes favorable, and therefore it is possible to prevent the occurrence of cracking in a cell or the chipping of the thin film electrode during the lamination molding of the solar cell module. On the other hand, when the melting peak is 30° C. or higher, it is possible to provide appropriately favorable flexibility to the resin composition, and therefore it is possible to easily obtain a sheet of the encapsulating material for solar cell through extrusion-molding. In addition, it is possible to prevent the sheet from becoming sticky and blocked, and to suppress the deterioration of the feeding property of the sheet.

(Volume Resistivity)

The volume resistivity of the encapsulating material for solar cell of the embodiment, which is based on JIS K6911 and measured at a temperature of 100° C. with an applied voltage of 500 V, is preferably in a range of $1.0 \times 10^{13}$ Ω·cm to $1.0 \times 10^{18}$ Ω·cm. The encapsulating material for solar cell having a large volume resistivity tends to have a characteristic that suppresses the occurrence of the PID phenomenon. Furthermore, while sunlight is being radiated, since there is a case in which the module temperature reaches, for example, 70° C. or higher in a solar cell module of the related art, the volume resistivity is required under a high-temperature condition rather than at room temperature (23° C.) which has been reported in the related art from the viewpoint of long-term reliability, and the volume resistivity at a temperature of 100° C. becomes important.

The volume resistivity which is based on JIS K6911 and measured at a temperature of 100° C. with an applied voltage of 500 V (hereinafter also simply referred to as "volume resistivity") is more preferably in a range of $1.0 \times 10^{14}$ Ω·cm to $1.0 \times 10^{18}$ Ω·cm, still more preferably in a range of $5.0 \times 10^{14}$ Ω·cm to $1.0 \times 10^{18}$ Ω·cm, and particularly preferably in a range of $1.0 \times 10^{15}$ Ω·cm to $1.0 \times 10^{18}$ Ω·cm. When the volume resistivity is equal to or more than $1.0 \times 10^{13}$ Ω·cm, it is possible to suppress the occurrence of the PID phenomenon for a short period of time (approximately one day) in a constant temperature and humidity test at 85° C. and 85% rh. When the volume resistivity is equal to or less than $1.0 \times 10^{18}$ Ω·cm, static electricity is not easily generated in the sheet, and therefore it is possible to prevent the adsorption of trash and thus to suppress the degradation of the power generation efficiency or the long-term reliability which is caused by the interfusion of trash into the solar cell module.

Meanwhile, when the volume resistivity is equal to or more than $5.0 \times 10^{14}$ Ω·cm, there is a tendency that the occurrence of the PID phenomenon can be suppressed for a longer period of time in the constant temperature and humidity test at 85° C. and 85% rh, which is desirable.

The volume resistivity is measured after the encapsulating material is molded into a sheet, and the sheet is crosslinked and processed into a flat sheet in a vacuum laminator, a hot press, a crosslinking furnace or the like. In addition, for a sheet in the module laminate, the volume resistivity is measured after other layers are removed.

(Content of an Aluminum Element)

The content (residue amount) of an aluminum element (hereinafter, also expressed as "Al") contained in the ethylene/α-olefin copolymer is preferably in a range of 10 ppm to 500 ppm, more preferably in a range of 20 ppm to 400 ppm, and still more preferably in a range of 20 ppm to 300 ppm. The content of Al is dependent on the concentration of an organic aluminumoxy compound or an organic aluminum compound being added during the polymerization process of the ethylene/α-olefin copolymer.

In a case in which the content of Al is equal to or more than 10 ppm, the organic aluminumoxy compound or the organic aluminum compound can be added during the polymerization process of the ethylene/α-olefin copolymer at a concentration at which the activity of a metallocene compound is sufficiently developed, and therefore it becomes unnecessary to add a compound which reacts with the metallocene compound so as to form an ion pair. In a case in which the compound forming the ion pair is added, there is a case in which the compound forming the ion pair remains in the ethylene/α-olefin copolymer such that the electric characteristics are degraded (for example, there is a tendency of electric characteristics degrading at a high temperature of approximately 100° C.), which can be prevented. In addition, a decrease in the content of Al requires a decalcification treatment using an acid or an alkali, and the acid or the alkali remaining in the obtained ethylene/α-olefin copolymer tends to corrode the electrode. In addition, the decalcification treatment increases the cost of the ethylene/α-olefin copolymer. However, when the content of Al is equal to or more than 10 ppm, the decalcification treatment becomes unnecessary.

In addition, when the content of Al is equal to or less than 500 ppm, it is possible to prevent the progress of the crosslinking reaction in an extruder, and therefore it is possible to prevent the generation of a gel-form foreign substance in a sheet of the encapsulating material for solar cell and the deterioration of the appearance of the sheet.

As a method for controlling the content of the above-described aluminum element contained in the ethylene/α-olefin copolymer, for example, it is possible to control the content of the aluminum element contained in the ethylene/α-olefin copolymer by adjusting the concentrations of the organic aluminumoxy compound (II-1) and the organic aluminum compound (II-2) described in the below-described method for manufacturing the ethylene/α-olefin copolymer in a manufacturing step or the polymerization activity of the metallocene compound among the conditions for manufacturing the ethylene/α-olefin copolymer.

(Method for Manufacturing the Ethylene/α-Olefin Copolymer)

The ethylene/α-olefin copolymer can be manufactured using a Ziegler compound, a vanadium compound, a metallocene compound, or the like as a catalyst. Among the above-described compounds, it is preferable to use any one of a variety of metallocene compounds described below when the ethylene/α-olefin copolymer is manufactured. Examples of the metallocene compounds that can be used include metallocene compounds described in Japanese Unexamined Patent Publication No. 2006-077261, Japanese Unexamined Patent Publication No. 2008-231265, Japanese Unexamined Patent Publication No. 2005-314680, and the like. However, a metallocene compound having a different structure from those of the metallocene compounds described in the above-described patent documents may also be used, and a combination of two or more metallocene compounds may also be used.

Preferable examples of a polymerization reaction in which the metallocene compound is used include the following aspects.

Ethylene and one or more monomers selected from α-olefins and the like are supplied in the presence of a catalyst for olefin polymerization composed of a well-known metallocene compound of the related art and at least one compound (also referred to as a promoter) selected from a group consisting of (II) (II-1) the organic aluminumoxy compound, (II-2) compounds that react with the metallocene (I) so as to form an ion pair, and (II-3) the organic aluminum compound.

As (II-1) the organic aluminumoxy compound, (II-2) the compounds that react with the metallocene (I) so as to form an ion pair, and (II-3) the organic aluminum compound, for example, the metallocene compounds described in Japanese Unexamined Patent Publication No. 2006-077261, Japanese Unexamined Patent Publication No. 2008-231265, Japanese Unexamined Patent Publication No. 2005-314680, and the like can be used. However, a metallocene compound having a different structure from those of the metallocene compounds described in the above-described patent documents may also be used. The above-described compounds may be individually injected into a polymerization atmosphere or be brought into contact with each other in advance and then injected into a polymerization atmosphere. Furthermore, for example, the compounds may be carried by the fine particle-shaped inorganic oxide carrier described in Japanese Unexamined Patent Publication No. 2005-314680 or the like.

Meanwhile, preferably, when the ethylene/α-olefin copolymer is manufactured without substantially using (II-2) the compound that reacts with the metallocene (I) so as to form an ion pair, it is possible to obtain the ethylene/α-olefin copolymer having excellent electric characteristics.

The polymerization of the ethylene/α-olefin copolymer can be carried out using any one of a well-known gas-phase polymerization method of the related art and a liquid-phase polymerization method such as a slurry polymerization method or a solution polymerization method. The polymerization is preferably carried out using the liquid-phase polymerization method such as the solution polymerization method. In a case in which the ethylene/α-olefin copolymer is manufactured by carrying out the copolymerization of ethylene and an α-olefin having 3 to 20 carbon atoms using the metallocene compound, (I) the metallocene compound is used in an amount in a range of, generally, $10^{-9}$ mole to $10^{-1}$ mole, and preferably $10^{-8}$ mole to $10^{-2}$ mole per a reaction volume of one liter.

The compound (II-1) is used in an amount in which the molar ratio [(II-1)/M] of the compound (II-1) to all transition metal atoms (M) in the compound (I) is generally in a range of 1 to 10000, and preferably in a range of 10 to 5000. The compound (II-2) is used in an amount in which the molar ratio [(II-2)/M] of the compound (II-2) to all the transition metal atoms (M) in the compound (I) is generally in a range of 0.5 to 50, and preferably in a range of 1 to 20. The compound (II-3) is used in an amount in a range of, generally, 0 millimoles to 5 millimoles, and preferably approximately 0 millimoles to 2 millimoles per a reaction volume of one liter.

In the solution polymerization method, when ethylene and an α-olefin having 3 to 20 carbon atoms are copolymerized in the presence of the above-described metallocene compound, it is possible to efficiently manufacture an ethylene/α-olefin copolymer having a large content of a copolymer, a narrow composition distribution and a narrow molecular weight distribution. Here, the preliminary molar ratio of ethylene to the α-olefin having 3 to 20 carbon atoms is generally in a range of 10:90 to 99.9:0.1, preferably in a range of 30:70 to 99.9:0.1, and more preferably in a range of 50:50 to 99.9:0.1 (ethylene:α-olefin).

The "solution polymerization method" is a collective term for all methods in which polymerization is carried out in a state in which a polymer is dissolved in an inert hydrocarbon solvent described below. In the solution polymerization method, the polymerization temperature is generally in a range of 0° C. to 200° C., preferably in a range of 20° C. to 190° C., and more preferably in a range of 40° C. to 180° C. In a case in which the polymerization temperature fails to satisfy 0° C., the solution polymerization method is not practical in terms of productivity since the polymerization activity is extremely degraded, and the removal of polymerization heat becomes difficult. Furthermore, when the polymerization temperature is higher than 200° C., the solution polymerization method is not practical in terms of productivity since the polymerization activity is extremely degraded.

The polymerization pressure is generally in a range of normal pressure to 10 MPa (gauge pressure), and preferably in a range of normal pressure to 8 MPa (gauge pressure). Copolymerization can be carried out in all of a batch method, a semi-continuous method, and a continuous method. The reaction time (the average retention time in a case in which a copolymer reaction is carried out using a continuous method) varies depending on the conditions such as the catalyst concentration and the polymerization temperature, and can be appropriately selected, but is generally in a range of one minute to three hours, and preferably in a range of ten minutes to 2.5 hours. Furthermore, it is also possible to carry out the polymerization in two or more steps with different reaction conditions. The molecular weight of the obtained ethylene/α-olefin copolymer can be adjusted by changing the concentration of hydrogen or the polymerization temperature in the polymerization system. Furthermore, the molecular weight of the ethylene/α-olefin copolymer can also be adjusted using the amount of the compound (II) being used. In a case in which hydrogen is added, the amount of hydrogen is appropriately in a range of approximately 0.001 NL to 5000 NL per kilogram of the ethylene/α-olefin copolymer being generated. In addition, a vinyl group and a vinylidene group present at the ends of a molecule in the obtained ethylene/α-olefin copolymer can be adjusted by increasing the polymerization temperature and extremely decreasing the amount of hydrogen being added.

A solvent used in the solution polymerization method is generally an inert hydrocarbon solvent, and is preferably a saturated hydrocarbon having a boiling point in a range of 50° C. to 200° C. at normal pressure. Specific examples thereof include aliphatic hydrocarbon such as pentane, hexane, heptane, octane, decane, dodecane, and kerosene; and alicyclic hydrocarbon such as cyclopentane, cyclohexane, and methylcyclopentane. Meanwhile, aromatic hydrocarbons such as benzene, toluene, and xylene and halogenated hydrocarbon such as ethylene chloride, chlorobenzene, and dichlorobenzene also belong to the scope of the "inert hydrocarbon solvent", and the use thereof is not limited.

As described above, in the solution polymerization method, not only the organic aluminumoxy compound dissolved in the aromatic hydrocarbon, which was frequently used in the related art, but also modified methyl aluminoxane dissolved in the aliphatic hydrocarbon or the alicyclic hydrocarbon such as MMA can be used. As a result, when the aliphatic hydrocarbon or the alicyclic hydrocarbon is employed as the solvent for the solution polymerization, it becomes possible to almost completely eliminate the possibility of the aromatic hydrocarbon being incorporated into the polymerization system or the ethylene/α-olefin copolymer being generated. That is, the solution polymerization method also has characteristics in that the environmental load can be reduced and the influence on human health can be minimized. Meanwhile, to suppress the variation in properties, it is preferable to melt the ethylene/α-olefin copolymer obtained through the polymerization reaction and other components added as desired using an arbitrary method, and to knead, granulate and the like the ethylene/α-olefin copolymer and other components.

(Hindered Amine-Based Light Stabilizer)

The encapsulating material for solar cell of the embodiment contains the hindered amine-based light stabilizer. When the hindered amine-based light stabilizer is contained, it is possible to trap harmful radicals in the ethylene/α-olefin copolymer, and to suppress the generation of new radicals.

Examples of the hindered amine-based light stabilizer that can be used include hindered amine-based light stabilizers such as bis(2,2,6,6-tetramethyl-4-piperidyl)sebacate, poly[{6-(1,1,3,3-tetramethylbutyl)amino-1,3,5-triazine-2,4-diyl}{(2,2,6,6-tetramethyl-4-piperidyl)imino}hexamethylene{(2,2,6,6-tetramethyl-4-piperidyl)imino}]; hindered pyperidine-based compounds; and the like.

In addition, it is also possible to use a low molecular weight hindered amine-based light stabilizer of the following general formula (1).

[Chem. 1]

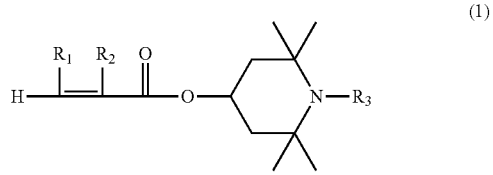

(1)

In the above general formula (1), $R_1$ and $R_2$ represent hydrogen, an alkyl group, or the like. $R_1$ and $R_2$ may be either identical or different. $R_1$ and $R_2$ are preferably hydrogen or methyl groups. $R_3$ represents hydrogen, an alkyl group, an alkenyl group or the like. $R_3$ is preferably hydrogen or a methyl group.

Specific examples of the hindered amine-based light stabilizer represented by the general formula (1) include
4-acryloyloxy-2,2,6,6-tetramethylpyperidine,
4-acryloyloxy-1,2,2,6,6-pentamethylpyperidine,
4-acryloyloxy-1-ethyl-2,2,6,6-tetramethylpyperidine,
4-acryloyloxy-1-propyl-2,2,6,6-tetramethylpyperidine,
4-acryloyloxy-1-butyl-2,2,6,6-tetramethylpyperidine,
4-methacryloyloxy-2,2,6,6-tetramethylpyperidine,
4-methacryloyloxy-1,2,2,6,6-pentamethylpyperidine, 4-methacryloyloxy-1-ethyl-2,2,6,6-tetramethylpyperidine,
4-methacryloyloxy-1-butyl-2,2,6,6-tetramethylpyperidine,
4-crotonoyloxy-2,2,6,6-tetramethylpyperidine,
4-crotonoyloxy-1-propyl-2,2,6,6-tetramethylpyperidine,
and the like.

In addition, it is also possible to use a high molecular weight hindered amine-based light stabilizer represented by the following formulae. The high molecular weight hindered amine-based light stabilizer refers to a light stabilizer having a molecular weight in a range of 1000 to 5000.

[Chem. 2]

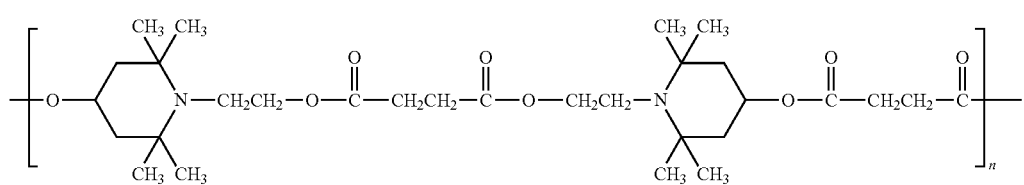

(2)

$n = 4\sim6$

[Chem. 3]

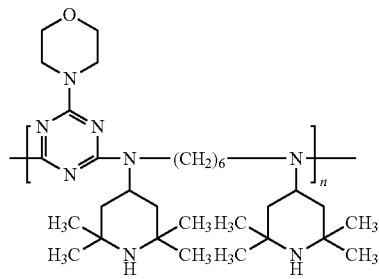

(3)

[Chem. 4]

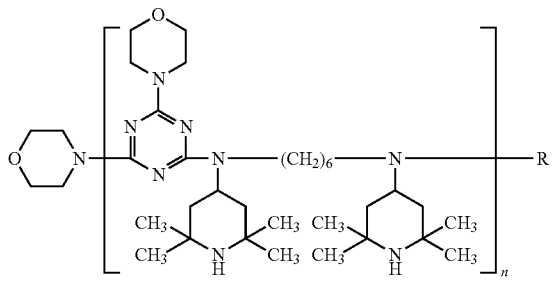

(4)

[Chem. 5]

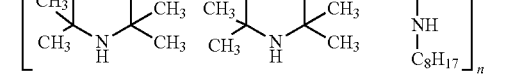

(5)

[Chem. 6]

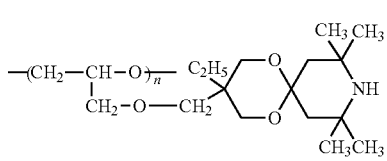

(6)

[Chem. 7]

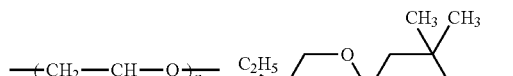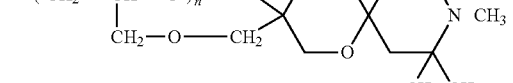

(7)

[Chem. 8]

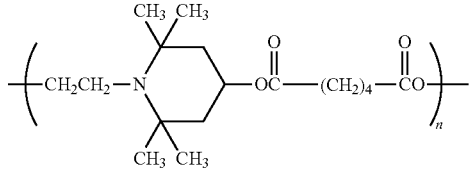

(8)

[Chem. 9]

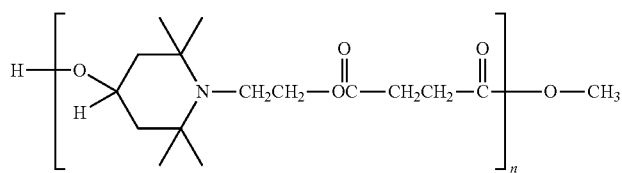

(9)

[Chem. 10]

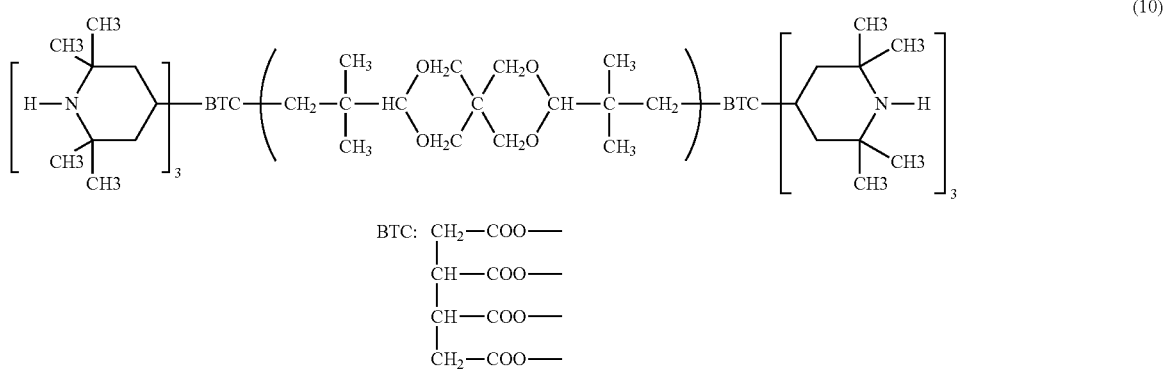

[Chem. 11]

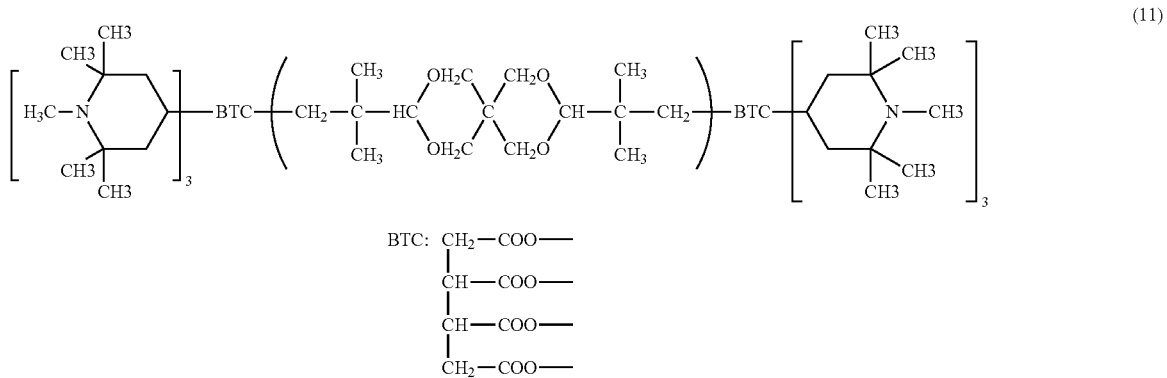

The content of the hindered amine-based light stabilizers in the encapsulating material for solar cell of the embodiment is preferably in a range of 0.01 parts by weight to 2.0 parts by weight, more preferably in a range of 0.01 parts by weight to 1.6 parts by weight, and particularly preferably in a range of 0.05 parts by weight to 1.6 parts by weight with respect to 100 parts by weight of the ethylene/α-olefin copolymer. When the content of the hindered amine-based light stabilizer is equal to or more than 0.01 parts by weight, the weather resistance and the heat resistance are favorable. When the content of the hindered amine-based light stabilizer is equal to or less than 2.0 parts by weight, it is possible to suppress the disappearance of a radical generated by the organic peroxide, and the adhesiveness, heat resistance, and crosslinking characteristics are favorable.

(Hindered Phenol-Based Stabilizer)

The encapsulating material for solar cell of the embodiment contains the hindered phenol-based stabilizer. When the hindered phenol-based stabilizer is contained, it is possible to trap harmful radicals in the ethylene/α-olefin copolymer in the presence of oxygen, to suppress the generation of new radicals, and to prevent oxidization deterioration.

A well-known compound can be used as the hindered phenol-based stabilizer, and examples thereof include 1,1,3-tris-(2-methyl-4-hydroxy-5-t-butylphenyl)butane, 4,4'-butylidene bis(3-methyl-6-t-butylphenol),2,2-thio bis(4-methyl-6-t-butylphenol), 7-octadecyl-3-(4'-hydroxy-3',5'-di-t-butylphenyl)propionate, tetrakis-[methylene-3-(3',5'-di-t-butyl-4'-hydroxyphenyl)propionate]methane, pentaerythritol-tetrakis[3-(3,5-di-t-butyl-4-hydroxyphenyl)propionate], triethylene glycol-bis[3-(3-t-butyl-5-methyl-4-hydroxyphenyl)propionate], 1,6-hexandiol-bis[3-(3,5-di-t-butyl-4-hydroxyphenyl)propionate], 2,4-bis(n-octylthio)-6-(4-hydroxy-3,5-di-t-butylanilino)-1,3,5-triazine, tris-(3,5-di-t-butyl-4-hydroxybenzyl)-isocyanurate, 2,2-thiodiethylene bis[3-(3,5-di-t-butyl-4-hydroxyphenyl) propionate], N,N'-hexamethylene bis(3,5-di-t-butyl-4-hydroxy)-hydro cinnamate amide, 2,4-bis[(octylthio) methyl]-o-cresol, 3,5-di-t-butyl-4-hydroxybenzyl-phosphonate-diethyl ester, tetrakis[methylene(3,5-di-t-butyl-4-hydroxyhydrocinnamate)]methane, octadecyl-3-(3,5-di-t-butyl-4-hydroxyphenyl)propionic acid ester, 3,9-bis[2-{3-(3-t-butyl-4-hydroxy-5-methylphenyl) propionyloxy}-1,1-dimethylethyl]-2,4-8,10-tetraoxaspiro [5.5]undecane, and the like. Among the above-described hindered phenol-based stabilizers, pentaerythritol tetrakis[3-(3,5-di-t-butyl-4-hydroxyphenyl)propionate], octadecyl-3-(3,5-di-t-butyl-4-hydroxyphenyl)propionic acid esters are preferred.

The content of the hindered phenol-based stabilizers in the encapsulating material for solar cell of the embodiment is preferably in a range of 0.005 parts by weight to 0.1 parts by weight, more preferably in a range of 0.01 parts by weight to 0.1 parts by weight, and particularly preferably in a range of 0.01 parts by weight to 0.06 parts by weight with respect to 100 parts by weight of the ethylene/α-olefin copolymer. When the content of the hindered phenol-based stabilizer is equal to or more than 0.005 parts by weight, the heat resistance is favorable, and there is a tendency that the yellowing of the encapsulating material for solar cell can be suppressed in, for example, a heat-resistant aging test at a high temperature of 120° C. or higher. When the content of the hindered phenol-based stabilizer is equal to or less than 0.1 parts by weight, the crosslinking characteristics of the encapsulating material for solar cell are favorable, and the heat resistance and the adhesiveness are favorable.

In addition, when the basic hindered phenol-based stabilizer is jointly used with a basic hindered amine-based light stabilizer in a constant temperature and humidity, there is a tendency that a hydroxyl group in the hindered phenol-based stabilizer forms a salt, a quinonized and dimerized conjugated bisquinone methide compound is formed, and the yellowing of the encapsulating material for solar cell easily occurs; however, when the content of the hindered phenol-based stabilizer is equal to or less than 0.1 parts by weight, it is possible to suppress the yellowing of the encapsulating material for solar cell.

(Phosphorous-Based Stabilizer)

The encapsulating material for solar cell of the embodiment contains the phosphorous-based stabilizer. When the phosphorous-based stabilizer is contained, it is possible to suppress the decomposition of the organic peroxide during extrusion molding, and to obtain a sheet having a favorable appearance. When the hindered amine-based light stabilizer and the hindered phenol-based stabilizer are contained, the generated radicals disappear, and it is also possible to produce a sheet having a favorable appearance, but the stabilizers are consumed in the sheet extrusion process, and there is a tendency that the long-term reliability such as heat resistance and weather resistance degrades.

A well-known compound of the related art can be used as the phosphorous-based stabilizer, and examples thereof include tris(2,4-di-tert-butylphenyl)phosphite, bis[2,4-bis(1,1-dimethylethyl)-6-methylphenyl]ethyl ester phosphite, tetrakis(2,4-di-tert-butylphenyl)[1,1-biphenyl]-4,4'-diyl bis-phosphonate, bis(2,4-di-tert-butylphenyl)pentaerythritol diphosphite, and the like. Among the above-described phosphorous-based stabilizers, tris(2,4-di-tert-butylphenyl)phosphite is preferred.

The content of the phosphorous-based stabilizers in the encapsulating material for solar cell of the embodiment is preferably in a range of 0.005 parts by weight to 0.5 parts by weight, more preferably in a range of 0.01 parts by weight to 0.5 parts by weight, and particularly preferably in a range of 0.02 parts by weight to 0.2 parts by weight with respect to 100 parts by weight of the ethylene/α-olefin copolymer. When the content of the phosphorous-based stabilizer is equal to or more than 0.005 parts by weight, it is possible to suppress the decomposition of the organic peroxide during extrusion molding, and to obtain a sheet having a favorable appearance. In addition, the heat resistance is favorable, and, for example, there is a tendency that the yellowing of the encapsulating material for solar cell can be suppressed in, for example, a heat-resistant aging test at a high temperature of 120° C. or higher. When the content of the phosphorous-based stabilizer is equal to or less than 0.5 parts by weight, the crosslinking characteristics of the encapsulating material for solar cell are favorable, and the heat resistance and the adhesiveness are favorable. In addition, there is no influence of an acid generated by the decomposition of the phosphorous-based stabilizer, and metal is also not corroded.

Meanwhile, there is a stabilizer having a phosphite ester structure and a hindered phenol structure in the same molecule; however, in a composition containing a large amount of the organic peroxide such as the encapsulating material for solar cell of the embodiment, the performance of suppressing the decomposition of the organic peroxide during extrusion molding is insufficient, and there is a tendency that a gel is generated and a sheet having a favorable appearance cannot be obtained.

(Organic Peroxide)

The encapsulating material for solar cell of the embodiment may contain an organic peroxide. The organic peroxide is used as a radical initiator during the graft modification of the silane coupling agent and the ethylene/α-olefin copolymer, and furthermore, is used as a radial initiator during a crosslinking reaction when the ethylene/α-olefin copolymer is lamination-molded to the solar cell module. When the silane coupling agent is graft-modified in the ethylene-based copolymer, a solar cell module having a favorable adhesiveness to the transparent surface protective member, the back surface protective member, a cell, and an electrode is obtained. Furthermore, when the ethylene/α-olefin copolymer is crosslinked, a solar cell module having excellent heat resistance and adhesiveness can be obtained.

The encapsulating material for solar cell of the embodiment is preferably used in a sheet shape as described below. The encapsulating material for solar cell molded in a sheet shape may not always contain the organic peroxide in a case in which a crosslinking reaction is not required during the subsequent lamination molding of the solar cell module. That is, the organic peroxide may be consumed as a radical initiator when the ethylene/α-olefin copolymer, which is a raw material resin, is melted and kneaded with the silane coupling agent so as to carry out graft modification so that the radical initiator may not remain in the molded sheet.

There is no particular limitation with the organic peroxide that can be preferably used as long as the organic peroxide is capable of graft-modifying the silane coupling agent in the ethylene/α-olefin copolymer or crosslinking the ethylene/α-olefin copolymer, and the one-minute half-life temperature of the organic peroxide is preferably in a range of 100° C. to 170° C. in consideration of the balance between the productivity during extrusion sheet molding and the crosslinking rate during the lamination molding of the solar cell module. When the one-minute half-life temperature of the organic peroxide is 100° C. or higher, it becomes difficult for a gel to be generated in a sheet of the encapsulating material for solar cell obtained from the resin composition during the extrusion sheet molding, and therefore it is possible to suppress an increase in the torque of the extruder and to facilitate sheet molding. In addition, since it is possible to suppress the sheet surface becoming uneven due to a gel-form substance in the extruder, the degradation of the appearance can be prevented. In addition, since it is possible to prevent the occurrence of cracking in the sheet when a voltage is applied, a decrease in the dielectric breakdown voltage can be prevented. Furthermore, the degradation of the moisture permeability can also be prevented. In addition, since it is possible to suppress the sheet surface becoming uneven, the tight adhesion among the transparent front protective member, a cell, an electrode and the back surface protective member becomes favorable during the lamination process of the solar cell module, and the adhesiveness also improves. When the extrusion temperature of the extrusion sheet molding is decreased to 90° C. or lower, while the molding is possible, the productivity significantly degrades. When the one-minute half-life temperature of the organic peroxide is 170° C. or lower, it is possible to suppress a decrease in the crosslinking rate during the lamination molding of the solar cell module, and therefore it is possible to prevent the degradation of the productivity of the solar cell module. In addition, it is also possible to prevent the degradation of the heat resistance and adhesiveness of the encapsulating material for solar cell.

A well-known organic peroxide can be used as the organic peroxide. Specific examples of the preferable organic peroxide having a one-minute half-life temperature in a range of 100° C. to 170° C. include dilauroyl peroxide, 1,1,3,3-tetramethylbutyl peroxy-2-ethylhexanoate, dibenzoyl peroxide, t-amylperoxy-2-ethylhexanoate, t-butylperoxy-2-ethylhexanotae, t-butylperoxy isobutyrate, t-butylperoxy maleate, 1,1-di(t-amylperoxy)-3,3,5-trimethylcyclohexane, 1,1-di(t-amylperoxy)cyclohexane, t-amylperoxy isononanoate, t-amylperoxy normaloctoate, 1,1-di(t-butylperoxy)-3,3,5-trimethylcyclohexane, 1,1-di(t-butylperoxy)cyclohexane, t-butylperoxy isopropyl carbonate, t-butylperoxy-2-ethylhexylcarbonate, 2,5-dimethyl-2,5-di(benzoylperoxy) hexane, t-amyl-peroxybenzoate, t-butylperoxy acetate, t-butylperoxy isononanoate, 2,2-di(t-butylperoxy)butane, t-butylperoxy benzoate, and the like. Preferable examples thereof include dilauroyl peroxide, t-butylperoxy isopropyl carbonate, t-butyl proxy acetate, t-butylperoxy isononanoate, t-butylperoxy-2-ethylhexyl carbonate, t-butylperoxy benzoate, and the like. The organic peroxide may be solely used or used in a mixture of two or more kinds.

The content of the organic peroxide in the encapsulating material for solar cell is preferably in a range of 0.1 parts by weight to 3 parts by weight, more preferably in a range of 0.2 parts by weight to 3 parts by weight, and particularly preferably in a range of 0.2 parts by weight to 2.5 parts by weight with respect to 100 parts by weight of the ethylene/α-olefin copolymer.

When the content of the organic peroxide is equal to or more than 0.1 parts by weight, the degradation of the crosslinking characteristics such as the crosslinking degree or crosslinking rate of the encapsulating material for solar cell is suppressed, and the graft reaction of the silane coupling agent with the main chain of the ethylene-based copolymer becomes favorable, whereby it is possible to suppress the degradation of the heat resistance and the adhesiveness.

When the content of the organic peroxide is equal to or less than 3.0 parts by weight, there is no gel generated in an encapsulating sheet for solar cell being obtained from the resin composition during extrusion sheet molding, the torque of an extruder can be suppressed, and sheet molding becomes easy. Since no gel-form substance is generated in the extruder, the sheet surface does not become uneven, and the appearance is favorable. In addition, since there is no gel, cracking does not occur due to a gel-form substance in the sheet even when a voltage is applied, and the dielectric breakdown voltage is favorable. In addition, the moisture permeability is also favorable. Furthermore, since the surface is not uneven, the adhesiveness among the transparent surface protective member, a cell, an electrode, and the back surface protective member is also favorable during the lamination process of the solar cell module.

(Silane Coupling Agent)

The encapsulating material for solar cell of the embodiment preferably further contains a silane coupling agent. The content of the silane coupling agent in the encapsulating material for solar cell of the embodiment is preferably in a range of 0.1 parts by weight to 5 parts by weight, more preferably in a range of 0.1 parts by weight to 4 parts by weight, and particularly preferably in a range of 0.1 parts by weight to 3 parts by weight with respect to 100 parts by weight of the ethylene/α-olefin copolymer.

When the content of the silane coupling agent is equal to or more than 0.1 parts by weight, the adhesiveness is improved. On the other hand, when the content of the silane coupling agent is equal to or less than 5 parts by weight, it is possible to suppress the addition amount of the organic peroxide for causing a graft reaction of the silane coupling agent in the ethylene/α-olefin copolymer during the lamination of the solar cell module. Therefore, it is possible to suppress gelatinization when the encapsulating material for solar cell is obtained in a sheet shape using an extruder, and consequently, it is possible to suppress the torque of the extruder, and therefore the molding of an extruded sheet becomes easy. Since no gel-form substance is generated in the extruder, the sheet surface does not become uneven, and the appearance of the sheet is favorable. In addition, since there is no gel, cracking does not occur due to a gel-form substance in the sheet even when a voltage is applied, and the dielectric breakdown voltage is favorable. In addition, the moisture permeability is also favorable.

In addition, while there is a case in which the silane coupling agent causes a condensation reaction and is present in a white bar form in the encapsulating material for solar cell so as to deteriorate the product appearance; however, when the content of the silane coupling agent is equal to or less than 5 parts by weight, the generation of the white bar can also be suppressed.

A well-known silane coupling agent of the related art can be used as the silane coupling agent, and there is no particular limitation. Specific examples thereof that can be used include vinyltriethoxysilane, vinyl trimethoxysilane, vinyl tris(β-methoxyethoxy)silane, 2-(3,4-epoxy cyclohexyl)ethyl trimethoxysilane, 3-glycidoxy propyl methyl dimethoxysilane, 3-glycidoxy propyl trimethoxysilane, 3-glycidoxy propyl methyl diethoxysilane, 3-glycidoxy propyl triethoxysilane, p-styryl trimethoxysilane, 3-aminopropyl triethoxysilane, 3-aminopropyl trimethoxysilane, N-2-(aminoethyl)-3-aminopropyl methyl dimethoxysilane, N-2-(aminoethyl)-3-aminopropyl trimethoxysilane, 3-triethoxysilyl-N-(1,3-dimethyl-butylidene)propylamine, N-phenyl-3-aminopropyl trimethoxysilane, 3-ureidopropyl triethoxysilane, 3-isocyanate propyl triethoxysilane, 3-methacryloxypropyl trimethoxysilane, 3-methacryloxypropyl methyl dimethoxysilane, 3-methacryloxypropyl methyl dimethoxysilane, 3-methacryloxypropyl triethoxysilane, 3-methacryloxypropyl methyl diethoxysilane, 3-acryloxypropyl trimethoxysilane, and the like. Preferable examples thereof include 3-glycidoxy propyl trimethoxysilane, 3-glycidoxypropyl triethoxysilane, 3-aminopropyl triethoxysilane, 3-methacryloxypropyl trimethoxysilane, 3-methacryloxypropyl triethoxysilane, 3-acryloxypropyl trimethoxysilane, and vinyltriethoxysilane due to their favorable adhesiveness.

(Ultraviolet Absorber)

The encapsulating material for solar cell of the embodiment preferably further contains an ultraviolet absorber.

The content of the ultraviolet absorber in the encapsulating material for solar cell of the embodiment is preferably in a range of 0.005 parts by weight to 5 parts by weight with respect to 100 parts by weight of the ethylene/α-olefin copolymer. When the content of the ultraviolet absorber is within the above-described range, a balance between the weather resistance stability and the crosslinking characteristics is excellent, which is preferable.

Specific examples of the ultraviolet absorber that can be used include benzophenone-based ultraviolet absorbers such as 2-hydroxy-4-normal-octyloxylbenzophenone, 2-hydroxy-4-methoxybenzophenone, 2,2-dihydroxy-4-methoxybenzophenone, 2-hydroxy-4-methoxy-4-carboxybenzophenone, and 2-hydroxy-4-n-octoxybenzophenone;

benzotriazole-based ultraviolet absorbers such as 2-(2-hydroxy-3,5-di-t-butylphenyl)benzotriazole and 2-(2-hydroxy-5-methylpheyl)benzotriazole; and salicylic acid ester-based ultraviolet absorbers such as phenyl salicylate and p-octyl phenyl salicylate.

(Other Additives)

The resin composition configuring the encapsulating material for solar cell of the embodiment can appropriately contain a variety of components other than the components described above in detail within the scope of the purpose of the invention. For example, other than the ethylene/α-olefin copolymer, a variety of polyolefins, styrene-based or ethylene-based block copolymers, propylene-based polymers, and the like can be contained. The content of a variety of the components in the encapsulating material for solar cell is preferably in a range of 0.0001 parts by weight to 50 parts by weight, and more preferably in a range of 0.001 parts by weight to 40 parts by weight with respect to 100 parts by weight of the ethylene/α-olefin copolymer. In addition, it is possible to appropriately contain one or more additives selected from a variety of resins other than polyolefins and/or a variety of rubbers, a plasticizer, a filler, a pigment, a dye, an antistatic agent, an antimicrobial agent, an antifungal agent, a flame retardant, a crosslinking aid, heat-resistant stabilizers other than the hindered phenol-based stabilizer and the phosphorous-based stabilizer, a dispersant, and the like.

Specific examples of the heat-resistant stabilizers other than the hindered phenol-based stabilizer and the phosphorous-based stabilizer include lactone-based heat-resistant stabilizers of reaction products of 3-hydroxy-5,7-di-tert-butyl-furan-2-on and o-xylene; sulfur-based heat-resistant stabilizers such as dimyristyl thiodipropionate, dilauryl thiodipropionate, distearyl thiodipropionate, ditridecyl thiodipropionate, pentaerythritol-tetrakis-(β-lauryl-thiopropionate), 2-mercapto benzoimidazole, zinc salts of 2-mercapto benzimidazole, 2-mercaptomethyl benzimidazole, zinc salts of 2-mercaptomethyl benzimidazole, 4,4'-thiobis(6-t-butyl-3-methylphenol), and 2,6-di-t-butyl-4-(4,6-bis(octylthio)-1,3,5-triazine-2-yl amine) phenol; amine-based heat-resistant stabilizers; and the like.

Particularly, in a case in which the crosslinking aid is contained, when the content of the crosslinking aid in the encapsulating material for solar cell of the embodiment is preferably in a range of 0.05 parts by weight to 5 parts by weight, and more preferably in a range of 0.1 parts by weight to 3 parts by weight with respect to 100 parts by weight of the ethylene/α-olefin copolymer. When the content of the crosslinking aid is within the above-described range, it is possible to provide an appropriate crosslinking structure, and to improve heat resistance, mechanical properties, and adhesiveness, which is preferable.

A well-known crosslinking aid of the related art that is ordinarily used for olefin-based resins can be used as the crosslinking aid. The crosslinking aid is a compound having two or more double bonds in the molecule. Specific examples thereof include monoacrylates such as t-butyl acrylate, lauryl acrylate, cetyl acrylate, stearyl acrylate, 2-methoxyethyl acrylate, ethylcarbitol acrylate, and methoxytripropylene glycol acrylate; monomethacrylates such as t-butyl methacrylate, lauryl methacrylate, cetyl methacrylate, stearyl methacrylate, methoxyethylene glycol methacrylate, and methoxypolyethylene glycol methacrylate; diacrylates such as 1,4-butanediol diacrylate, 1,6-hexanediol diacrylate, 1,9-nonanediol diacrylate, neopentyl glycol diacrylate, diethylene glycol diacrylate, tetraethylene glycol diacrylate, polyethylene glycol diacrylate, tripropylene glycol diacrylate, and polypropylene glycol diacrylate; dimethacrylates such as 1,3-butanediol dimethacrylate, 1,6-hexanediol dimethacrylate, 1,9-nonanediol methacrylate, neopentyl glycol dimethacrylate, ethylene glycol dimethacrylate, diethylene glycol dimethacrylate, triethylene glycol dimethacrylate, and polyethylene glycol dimethacrylate; triacrylates such as trimethylol propane triacrylate, tetramethylol methane triacrylate, and pentaerythritol triacrylate; trimethacrylates such as trimethylol propane trimethacrylate and trimethylol ethane trimethacrylate; tetraacrylates such as pentaerythritol tetraacrylate and tetramethylol methane tetraacrylate; divinyl aromatic compounds such as divinyl benzene and di-i-propenyl benzene; cyanurates such as triallyl cyanurate and triallyl isocyanurate; diallyl compounds such as diallyl phthalate; and triallyl compounds: oximes such as p-quinone dioxime and p,p'-dibenzoyl quinone dioxime; and maleimides such as phenyl maleimide.

Among the above-described crosslinking aids, diacrylate, dimethacrylate, divinyl aromatic compounds, triacrylates such as trimethylol propane triacrylate, tetramethylol methane triacrylate and pentaerythritol triacrylate; trimethacrylates such as trimethylol propane trimethacrylate and trimethylol ethane trimethacrylate; tetraacrylates such as pentaerythritol tetraacrylate and tetramethylol methane tetraacrylate; cyanurates such as triallyl cyanurate and triallyl isocyanurate; diallyl compounds such as diallyl phthalate; triallyl compounds; oximes such as p-quinone dioxime and p,p'-dibenzoyl quinonedioxime; maleimides such as phenyl maleimide are more preferred. Furthermore, among the above-described crosslinking aids, triallyl isocyanurate is particularly preferred since the generation of air bubbles in the encapsulating material for solar cell after lamination is most suppressed and the balance between crosslinking characteristics is excellent.

The encapsulating material for solar cell of the embodiment is preferably composed of a resin composition in which the content of the hindered phenol-based stabilizer is in a range of 0.005 parts by weight to 0.1 parts by weight, the content of the hindered amine-based light stabilizer is in a range of 0.01 parts by weight to 2.0 parts by weight, and the content of the phosphorous-based stabilizer is in a range of 0.005 parts by weight to 0.5 parts by weight with respect to 100 parts by weight of the above-described ethylene/α-olefin copolymer. In addition, in a case in which the organic peroxide is contained, the encapsulating material for solar cell of the embodiment is preferably composed of a resin composition in which the content of the organic peroxide is in a range of 0.1 parts by weight to 3 parts by weight with respect to 100 parts by weight of the above-described ethylene/α-olefin copolymer.

Furthermore, the encapsulating material for solar cell of the embodiment is preferably composed of a resin composition in which the content of the hindered phenol-based stabilizer is in a range of 0.01 parts by weight to 0.06 parts by weight, the content of the hindered amine-based light stabilizer is in a range of 0.05 parts by weight to 1.6 parts by weight, and the content of the phosphorous-based stabilizer is in a range of 0.02 parts by weight to 0.2 parts by weight with respect to 100 parts by weight of the above-described ethylene/α-olefin copolymer. In addition, in a case in which the organic peroxide is contained, the encapsulating material for solar cell of the embodiment is preferably composed of a resin composition in which the content of the organic peroxide is in a range of 0.2 parts by weight to 2.5 parts by weight with respect to 100 parts by weight of the above-described ethylene/α-olefin copolymer.

The encapsulating material for solar cell of the embodiment is excellent in terms of the heat resistance and the resistance against a constant temperature and humidity, furthermore, the adhesiveness to a variety of solar cell members such as the transparent surface protective member, the back surface protective member, a thin-film electrode, aluminum, and the solar cell element, the heat resistance, the balance between the extrusion moldability and the cross-linking characteristics, transparency, flexibility, appearance, weather resistance, volume resistivity, electrical insulating properties, moisture permeability, electrode corrosion properties, and the balance of process stability. Therefore, the encapsulating material for solar cell of the invention is preferably used as an encapsulating material for solar cell for a well-known solar cell module of the related art. An ordinarily-used method can be used as the method for manufacturing the encapsulating material for solar cell of the embodiment, but the encapsulating material for solar cell is preferably manufactured through melting and blending using a kneader, a Banbury mixer, an extruder, or the like. Particularly, manufacturing using an extruder capable of continuous production is preferred.

A preferable embodiment of the encapsulating material for solar cell has a sheet shape as the entire shape. In addition, an encapsulating material for solar cell complexed with other layers including at least one sheet made of the above-described resin composition can also be preferably used. The thickness of the layer of the encapsulating material for solar cell is generally in a range of 0.01 mm to 2 mm, preferably in a range of 0.05 mm to 1.5 mm, more preferably in a range of 0.1 mm to 1.2 mm, still more preferably in a range of 0.2 mm to 1 mm, particularly preferably in a range of 0.3 mm to 0.9 mm, and most preferably in a range of 0.3 mm to 0.8 mm. When the thickness is within the above-described range, it is possible to suppress the breakage of the transparent surface protective member, a solar cell element, a thin film electrode, and the like during the lamination step and to sufficiently ensure light transmittance, thereby obtaining a great light power generation amount. Furthermore, the lamination molding of the solar cell module at a low temperature is possible, which is preferable.

There is no particular limitation with the method for molding an encapsulating sheet for solar cell, and a variety of well-known molding methods (cast molding, extrusion sheet molding, inflation molding, injection molding, compression molding, and the like) can be employed. Particularly, a method is most preferred in which a resin composition of the ethylene/α-olefin copolymer and a variety of additives obtained by manually blending the ethylene/α-olefin copolymer, the hindered amine-based light stabilizer, the hindered phenol-based stabilizer, the phosphorous-based stabilizer, if necessary, the organic peroxide, the silane coupling agent, the ultraviolet absorber, and other additives in a bag such as a plastic bag or blending them using a stirring and mixing machine such as a Henschel mixer, a tumbler, or a super mixer, is injected into an extrusion sheet molding hopper, and extrusion sheet molding is carried out while melting and kneading the mixture, thereby obtaining a sheet-shaped encapsulating material for solar cell.

Meanwhile, when a pellet is produced from the blended resin composition using an extruder, and furthermore, a sheet is produced from the pellet through extrusion molding or press molding, it is usual to immerse the sheet in an aqueous layer or to cool strands using an underwater cutter-type extruder and cut the strands to obtain pellets. Therefore, there is moisture attached to the sheet, the deterioration of additive, particularly the silane coupling agent, occurs, and for example, when an attempt is made to produce a sheet again using an extruder, a condensation reaction between the silane coupling agents proceeds, and there is a tendency that the adhesiveness degrades, which is not preferable. In addition, in a case in which a master batch of the ethylene/α-olefin copolymer and the additives excluding the organic peroxide or the silane coupling agent (the stabilizers such as the hindered phenol-based stabilizer, the phosphorous-based stabilizer, the hindered amine-based light stabilizer, and the ultraviolet absorber) is produced in advance using an extruder, then, the organic peroxide or the silane coupling agent is blended, and a sheet is molded again using an extruder, the stabilizers such as the hindered phenol-based stabilizer, the phosphorous-based stabilizer, the hindered amine-based light stabilizer, and the ultraviolet absorber are subjected to the extruder twice, and therefore the stabilizers deteriorate, and there is a tendency that the long-term reliability such as weather resistance or heat resistance degrades, which is not preferable.

Regarding the extrusion temperature range, the extrusion temperature is in a range of 100° C. to 130° C. When the extrusion temperature is 100° C. or higher, the productivity of the encapsulating material for solar cell can be improved. When the extrusion temperature is 130° C. or lower, gelatinization does not easily occur when the resin composition is made into a sheet using an extruder so as to obtain an encapsulating material for solar cell. Therefore, it is possible to prevent an increase in the torque of the extruder and to facilitate sheet molding. In addition, since the sheet surface does not easily become uneven, it is possible to prevent the degradation of the appearance. In addition, since it is possible to suppress the occurrence of cracking in the sheet when a voltage is applied, a decrease in the dielectric breakdown voltage can be prevented. Furthermore, it is also possible to suppress the moisture permeability. In addition, since the sheet surface does not easily become uneven, the tight adhesiveness to the transparent surface protective member, the cell, the electrode, and the back protective member becomes favorable during the lamination process of the solar cell module, and the adhesiveness is excellent.

In addition, in a case in which MFR of the ethylene/α-olefin copolymer is, for example, equal to or less than 10 g/10 minutes, it is also possible to obtain a sheet-shaped encapsulating material for solar cell by carrying out calendar molding using a calendar molder in which a molten resin is rolled using a metal roll obtained by heating a molten resin (calendar roll) so as to produce a sheet or film having a desired thickness while melting and kneading the ethylene/α-olefin copolymer, the hindered amine-based light stabilizer, the hindered phenol-based stabilizer, the phosphorous-based stabilizer, and, if necessary, the organic peroxide, the silane coupling agent, the ultraviolet absorber, and other additives. A variety of well-known calendar molders can be used as the calendar molder, and it is possible to use a mixing roll, a three roll calendar, or a four roll calendar. Particularly, I-type, S-type, inverse L-type, Z-type, and inclined Z-type calendar rolls can be used as the four roll calendar. In addition, the ethylene-based resin composition is preferably heated to an appropriate temperature before being applied to the calendar roll, and it is also one of preferable embodiments to install, for example, a Banbury mixer, a kneader, an extruder, or the like. Regarding the temperature range for the calendar molding, the roll temperature is preferably set in a range of, ordinarily, 40° C. to 100° C.

In addition, the surface of the sheet (or the layer) of the encapsulating material for solar cell may be embossed.

When the sheet surface of the encapsulating material for solar cell is decorated through an embossing process, it is possible to prevent the blocking between the encapsulating material sheets or between the encapsulating material sheet and other sheets. Furthermore, since embosses decrease the storage elastic modulus of the encapsulating material for solar cell (the sheet of the encapsulating material for solar cell), the embosses serve as cushions for the solar cell element and the like during the lamination of the sheet of the encapsulating material for solar cell and the solar cell element, and the breakage of the solar cell element can be prevented.

The porosity P (%), which is expressed by the percentage ratio $V_H/V_A \times 100$ of the total volume $V_H$ of the concave portions per the unit area of a sheet of the encapsulating material for solar cell to the apparent volume $V_A$ of the sheet of the encapsulating material for solar cell is preferably in a range of 10% to 50%, more preferably in a range of 10% to 40%, and still more preferably in a range of 15% to 40%. Meanwhile, the apparent volume $V_A$ of the sheet of the encapsulating material for solar cell can be obtained by multiplying the unit area by the maximum thickness of the encapsulating material for solar cell. When the porosity P is equal to or more than 10%, it is possible to sufficiently decrease the elastic modulus of the encapsulating material for solar cell, and therefore it is possible to obtain sufficient cushion properties. Therefore, when the lamination process (pressurization step) is carried out in two phases in a step for manufacturing the module, it is possible to prevent the cracking in a silicon cell or a solder fixing a silicon cell and an electrode in a crystalline solar cell and to prevent the cracking of a silver electrode in a thin film-based solar cell. That is, when the porosity of the encapsulating material for solar cell including the sheet made of the resin composition is equal to or more than 10%, convex portions to which the pressure is added are deformed so as to break even when there is a case in which a pressure is locally added to the encapsulating material for solar cell. Therefore, during the lamination process, for example, even when a large pressure is locally added to the silicon cell or the like, it is possible to prevent the cracking of the silicon cell. In addition, when the porosity of the encapsulating material for solar cell is equal to or more than 10%, an air ventilation path can be ensured, and therefore it is possible to favorably exhaust air during the lamination process. Therefore, it is possible to prevent air from remaining in the solar cell module so as to deteriorate the appearance and to prevent the electrode from being corroded due to moisture in the remaining air when the solar cell module is used for a long period of time. Furthermore, since the number of pores generated in the flowed resin composition is decreased during the lamination, the resin composition does not squeeze outside a variety of adherends that are attached to the solar cell module so as to prevent the contamination of the laminator.

On the other hand, when the porosity P is equal to or less than 80%, air can be favorably exhausted during the pressurization in the lamination process, and therefore it is possible to prevent air from remaining in the solar cell module. Therefore, the deterioration of the appearance of the solar cell module is prevented, and the electrode is not corroded due to moisture in the remaining air when the solar cell module is used for a long period of time. In addition, since it is possible to favorably exhaust air during the pressurization in the lamination process, the attaching area between the encapsulating material for solar cell and the adherends to be attached increases, and a sufficient adhering strength can be obtained.

The porosity P can be obtained through the following calculation. The apparent volume $V_A$ (mm$^3$) of the embossed encapsulating material for solar cell is computed through the product of the maximum thickness $t_{max}$(mm) and unit area (for example, 1 m$^2$=1000 mm×1000 mm=10$^6$ mm$^2$) of the encapsulating material for solar cell as described in the following equation (12).

$$V_A \text{ (mm}^3\text{)} = t_{max} \text{ (mm)} \times 10^6 \text{ (mm}^2\text{)} \quad (12)$$

Meanwhile, the actual volume $V_0$ (mm$^3$) of the unit area of the encapsulating material for solar cell is computed by applying the specific weight ρ (g/mm$^3$) of a resin configuring the encapsulating material for solar cell and the actual weight W (g) of the encapsulating material for solar cell per unit area (1 m$^2$) to the following equation (13).

$$V_0 \text{ (mm}^3\text{)} = W/\rho \quad (13)$$

The total volume $V_H$ (mm$^3$) of the concave portions per the unit area of the encapsulating material for solar cell is computed by subtracting the "actual volume $V_0$" from the "apparent volume $V_A$ of the encapsulating material for solar cell" as described in the following equation (14).

$$V_H \text{ (mm}^3\text{)} = V_A - V_0 = V_A - (W/\rho) \quad (14)$$

Therefore, the porosity (%) can be obtained in the following manner.

$$\begin{aligned} \text{Porosity } P(\%) &= V_H/V_A \times 100 \\ &= (V_A - (W/\rho))/V_A \times 100 \\ &= 1 - W/(\rho \cdot V_A) \times 100 \\ &= 1 - W/(\rho \cdot t_{max} \cdot 10^6) \times 100 \end{aligned}$$

The porosity P (%) can be obtained using the above-described equation, and can also be obtained by photographing a cross-section or embossed surface of an actual encapsulating material for solar cell using a microscope and then processing the image or the like.

The depth of the concave portion formed through the embossing process is preferably in a range of 20% to 95%, more preferably in a range of 50% to 95%, and more preferably in a range of 65% to 95% of the maximum thickness of the encapsulating material for solar cell. There is a case in which the percentage ratio of the depth D of the concave portion to the maximum thickness $t_{max}$ of the sheet is called the "depth ratio" of the concave portion.

The depth of the concave portion by the embossing process indicates the depth difference D between the top portion of the convex portion and the bottom portion of the concave portion in the uneven surface of the encapsulating material for solar cell formed through the embossing process. In addition, the maximum thickness $t_{max}$ of the encapsulating material for solar cell indicates the distance from the top portion of the convex portion on one surface to the other surface (in the thickness direction of the encapsulating material for solar cell) in a case in which only one surface of the encapsulating material for solar cell is embossed, and indicates the distance from the top portion of the convex portion on one surface to the bottom portion of the proportion portion on the other surface (in the thickness direction of the encapsulating material for solar cell) in a case in which both surfaces of the encapsulating material for solar cell are embossed.

The embossing process may be carried out on a single surface or on both surfaces of the encapsulating material for solar cell. In a case in which the depth of the concave portion through the embossing process is set to be large, the concave portions are preferably formed only on a single surface of the encapsulating material for solar cell. In a case in which the embossing process is carried out only on a single surface of the encapsulating material for solar cell, the maximum thickness $t_{max}$ of the encapsulating material for solar cell is in a range of 0.01 mm to 2 mm, preferably in a range of 0.05 mm to 1 mm, more preferably in a range of 0.1 mm to 1 mm, still more preferably in a range of 0.15 mm to 1 mm, still more preferably in a range of 0.2 mm to 1 mm, still more preferably in a range of 0.2 mm to 0.9 mm, particularly preferably in a range of 0.3 mm to 0.9 mm, and most preferably in a range of 0.3 mm to 0.8 mm. When the maximum thickness $t_{max}$ of the encapsulating material for solar cell is within the above-described range, it is possible to suppress the breakage of the transparent surface protective member, the solar cell element, the thin film electrode and the like, and to laminate-mold the solar cell module at a relative low temperature, which is preferable. In addition, the encapsulating material for solar cell is capable of ensuring a sufficient light transmittance, and the solar cell module for which the above-described encapsulating material for solar cell is used has a high light transmittance.

Furthermore, a sheet thereof can be used as an encapsulating material for solar cell in a leaflet form that has been cut in accordance with the size of the solar cell module or in a roll form that can be cut in accordance with the size immediately before the solar cell module is produced. The sheet-shaped encapsulating material for solar cell (the sheet of the encapsulating material for solar cell) which is a preferable embodiment of the embodiment needs to have at least one layer made of the encapsulating material for solar cell. Therefore, the number of the layers made of the encapsulating material for solar cell of the embodiment may be one or multiple. The number of the layers made of the encapsulating material for solar cell of the invention is preferably one since the structure can be simplified so as to decrease the cost, the interface reflection between layers is extremely decreased, and light is effectively used.

The sheet of the encapsulating material for solar cell may be configured only of layers made of the encapsulating material for solar cell of the embodiment, or may have layers other than a layer containing the encapsulating material for solar cell (hereinafter, also referred to as "other layers"). The other layers can be classified based on the purposes into, for example, a back coat layer for protecting the front surface or the back surface, an adhering layer, an antireflection layer, a gas barrier layer, an anti-contamination layer, and the like. The other layers can be classified based on the material into, for example, an ultraviolet-curable resin layer, a thermosetting resin layer, a polyolefin resin layer, a carboxylic acid-modified polyolefin resin layer, a fluorine-containing resin layer, a cyclic olefin (co) polymer layer, an inorganic compound layer, and the like.

There is no particular limitation with the positional relationship between the layer made of the encapsulating material for solar cell of the embodiment and the other layers, and a preferable layer configuration is appropriately selected in consideration of the relationship with the object of the invention. That is, the other layers may be provided between two or more layers made of the encapsulating material for solar cell, may be provided on the outermost layer of the sheet of the encapsulating material for solar cell, or may be provided at locations other than what has been described above. In addition, the other layers may be provided only on a single surface or on both surfaces of the layer made of the encapsulating material for solar cell. The number of the other layers is not particularly limited, and an arbitrary number of other layers may be provided or no other layer may be provided.

To simplify the structure so as to decrease the cost, extremely decrease the interface reflection between layers, and effectively use light, it is preferable to produce a sheet of the encapsulating material for solar cell only with a layer made of the encapsulating material for solar cell of the embodiment without providing the other layers. However, when there are layers necessary or useful in terms of purpose, the other layers may be provided as appropriate. In a case in which the other layers are provided, there is no particular limitation with a method for laminating a layer made of the encapsulating material for solar cell of the embodiment and the other layers, but a method in which layers are co-extruded using a well-known melt extruder such as a casting molder, an extrusion sheet molder, an inflation molder or an injection molder, thereby obtaining a laminate or a method in which one layer is melted or laminated by heating on the other layer that has been formed in advance, thereby obtaining a laminate is preferred. In addition, the layers may be laminated using a dry laminate method, a heat laminate method or the like in which an appropriate adhesive (for example, a maleic acid anhydride-modified polyolefin resin (product name "ADOMER (registered trademark)" manufactured by Mitsui Chemicals, Inc.), "MODIC (registered trademark)" manufactured by Mitsubishi Chemical Corporation or the like), a low (non) crystalline soft polymer such as an unsaturated polyolefin, an acrylic adhesive including an ethylene/acrylic acid ester/maleic acid anhydride-ternary copolymer (trade name "BONDINE (registered trademark)" manufactured by Sumika CdF Chemical Company Limited.), an ethylene/vinyl acetate-based copolymer, an adhesive resin composition containing what has been described above, or the like) is used. An adhesive having heat resistance in a range of approximately 120° C. to 150° C. is preferably used as the adhesive, and preferable examples thereof include polyester-based adhesives, polyurethane-based adhesive, and the like. In addition, to improve the adhesiveness between both surfaces, for example, a silane-based coupling treatment, a titanium-based coupling treatment, a corona treatment, a plasma treatment, or the like may be used.

2. Regarding the Solar Cell Module

An example of the solar cell module is a crystalline solar cell module obtained by, generally, sandwiching a solar cell element formed of polycrystalline silicon or the like using the sheets of the encapsulating material for solar cell, laminating the solar cell element, and furthermore, covering the front and back surfaces with protective sheets. That is, a typical solar cell module has a configuration of a protective sheet for a solar cell module (a transparent surface protective member)/the encapsulating material for solar cell/the solar cell element/the encapsulating material for solar cell/a protective sheet for a solar cell module (a back surface protective member). However, the solar cell module which is one of the preferable embodiments of the embodiment is not limited to the above-described configuration, and some of the above-described layers can be appropriately removed or layers other than the above-described layers can be appropriately provided within the scope of the object of the invention. Examples of layers other than the above-described layers include an adhering layer, a shock absorbing layer, a coating layer, an anti-reflection layer, a back surface re-reflection layer and a light diffusion layer. The above-described layers are not particularly limited, and can be provided at appropriate locations in consideration of the purpose or characteristics of providing the respective layers.

(Crystalline Silicon-Based Solar Cell Module)

FIG. 1 is a cross-sectional view schematically illustrating an embodiment of the solar cell module of the invention. Meanwhile, in FIG. 1, an example of the configuration of a crystalline silicon-based solar cell module 20 is illustrated. As illustrated in FIG. 1, the solar cell module 20 includes a plurality of crystalline silicon-based solar cell elements 22 electrically connected through an interconnector 29 and a pair of a transparent surface protective member 24 and a back surface protective member 26 which sandwich the solar cell elements, and an encapsulating layer 28 is loaded between the protective members and a plurality of the solar cell elements 22. The encapsulating layer 28 is obtained by attaching, heating and pressurizing the encapsulating material for solar cell of the embodiment, and is in contact with electrodes formed on the light-incident surfaces and back surfaces of the solar cell elements 22. The electrodes refer to collector members respectively formed on the light-incident surfaces and the back surfaces of the solar cell elements 22, and the electrode includes collector lines, tab-type busbars, a back surface electrode layer and the like which will be described below.

Figure 2:
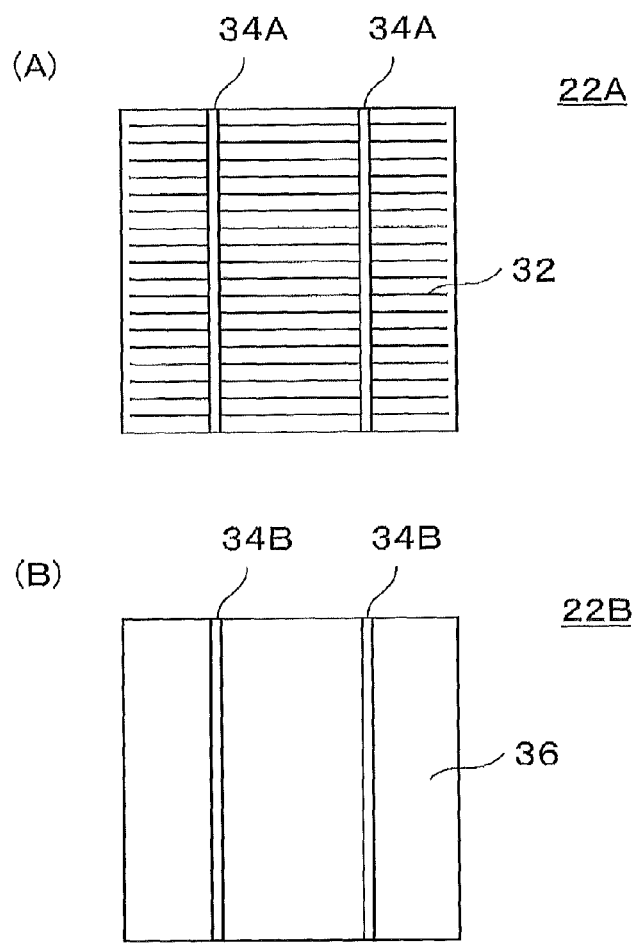
FIG. 2 is a plan view schematically illustrating a configuration example of a light-incident surface and a back surface of a solar cell element.

FIG. 2 is a plan view schematically illustrating a configuration example of the light-incident surface and the back surface of the solar cell element. In FIG. 2, examples of the configurations of a light-incident surface 22A and a back surface 22B of the solar cell element 22 are illustrated. As illustrated in FIG. 2(A), a number of linearly-formed collector lines 32 and tab-type busbars (busbars) 34A which collect charges from the collector lines 32 and are connected to the interconnector 29 (FIG. 1) are formed on the light-incident surface 22A of the solar cell element 22. In addition, as illustrated in FIG. 2(B), a conductive layer (back surface electrode) 36 is formed on the entire back surface 22B of the solar cell element 22, and tab-type busbars (busbars) 34B which collect charges from the conductive layer 36 and are connected to the interconnector 29 (FIG. 1) are formed on the conductive layer. The line width of the collector line 32 is, for example, approximately 0.1 mm; the line width of the tab-type busbar 34A is, for example, in a range of approximately 2 mm to 3 mm; and the line width of the tab-type busbar 34B is, for example, in a range of approximately 5 mm to 7 mm. The thicknesses of the collector line 32, the tab-type busbar 34A and the tab-type busbar 34B are, for example, in a range of approximately 20 μm to 50 μm respectively.

The collector line 32, the tab-type busbar 34A and the tab-type busbar 34B preferably contain highly conductive metal. Examples of the highly conductive metal include gold, silver, copper, and the like, and silver, a silver compound, a silver-containing alloy, and the like are preferred due to the high conduction property or high corrosion resistance. The conductive layer 36 preferably contains not only highly conductive metal but also a highly light-reflecting component, for example, aluminum since light incident on the light-incident surface is reflected so as to improve the photoelectric conversion efficiency of the solar cell element. The collector line 32, the tab-type busbar 34A, the tab-type busbar 34B, and the conductive layer 36 are formed by applying a coating material of a conductive material containing the above-described highly conductive metal to the light-incident surface 22A or the back surface 22B of the solar cell element 22 to a thickness of a coated film of 50 μm through, for example, screen printing, then, drying the coated film, and, if necessary, baking the coated film at a temperature in a range of, for example, 600° C. to 700° C.

The transparent surface protective member 24 is disposed on the light-incident surface side, and is thus required to be transparent. Examples of the transparent surface protective member 24 include a transparent glass plate, a transparent resin film, and the like. On the other hand, the back surface protective member 26 is not required to be transparent, and a material for the back surface protective member is not particularly limited. Examples of the back surface protective member 26 include a glass substrate, a plastic film, and the like, and a glass substrate is preferably used from the viewpoint of durability or transparency.

The solar cell module 20 can be obtained using an arbitrary manufacturing method. The solar cell module 20 can be obtained using a step in which a laminate of the back surface protective member 26, the encapsulating material for solar cell, a plurality of the solar cell elements 22, the encapsulating material for solar cell and the transparent surface protective member 24 laminated in this order is obtained; a step in which the laminate is pressurized and attached using a laminator or the like, and is heated at the same time as necessary; and a step in which, after the above-described steps, a heating treatment is further carried out on the laminate as necessary so as to cure the encapsulating material.

Generally, a collection electrode for extracting generated electricity is disposed in the solar cell element. Examples of the collection electrode include a busbar electrode, a finger electrode, and the like. Generally, the collection electrode is disposed on the front and back surfaces of the solar cell element; however, when the collection electrode is disposed on the light-incident surface, the collection electrode shields light, and therefore a problem of the degradation of the power generation efficiency is caused.

In addition, to improve the power generation efficiency, it is possible to use a back contact-type solar cell element which is not required to have the collection electrode disposed on the light-incident surface. In an aspect of the back contact-type solar cell element, p-doped regions and n-doped regions are alternately provided on the back surface side which is provided on the opposite side to the light-incident surface of the solar cell element. In another aspect of the back contact-type solar cell element, a p/n junction is formed in a substrate provided with through holes, a doped layer on the front surface (light-incident surface) side is formed on up to the inner walls of the through holes and the periphery portions of the through holes on the back surface side, and a current on the light-incident surface is extracted on the back surface side.

Generally, in a solar cell system, several or several tens of the above-described solar cell modules are connected in series, and are operated at a voltage in a range of 50 V to 500 V for small-scale residential use, and at a voltage in a range of 600 V to 1000 V for large-scale use called a mega solar power generation system. An aluminum frame is used as the outer frame of the solar cell module for the purpose of holding the strength and the like, and an aluminum frame is frequently earthed (grounded) from the viewpoint of safety. As a result, when the solar cell generates power, a voltage difference is generated by power generation between the surface of the transparent surface protective member having a lower electric resistance compared with the encapsulating material and the solar cell element.

As a result, for the encapsulating material for solar cell that encapsulates the space between a power generation cell and the transparent surface protective member or the aluminum frame, there is a demand for favorable electric characteristics such as high electric insulating properties and high resistance.

(Thin Film Silicon-Based (Amorphous Silicon-Based) Solar Cell Module)

The thin film silicon-based solar cell module can be (1) a module in which the transparent surface protective member (the glass substrate)/a thin film solar cell element/an encapsulating layer/the back surface protective member are laminated in this order; (2) a module in which the transparent surface protective member/the encapsulating layer/the thin film solar cell element/the encapsulating layer/the back surface protective member are laminated in this order; or the like. The transparent surface protective member, the back surface protective member and the encapsulating layer are the same as in the case of the above-described "crystalline silicon-based solar cell module".

The thin film solar cell element in the (1) aspect includes, for example, a transparent electrode layer/a pin-type silicon layer/a back surface electrode layer in this order. Examples of the transparent electrode layer include semiconductor-based oxides such as $In_2O_3$, $SnO_2$, ZnO, $Cd_2SnO_4$, and ITO (an oxide obtained by adding Sn to $In_2O_3$). The back surface electrode layer includes, for example, a silver thin film layer. The respective layers are formed using a plasma chemical vapor deposition (CVD) method or a sputtering method. The encapsulating layer is disposed so as to be in contact with the back surface electrode layer (for example, a silver thin film layer). Since the transparent electrode layer is formed on the transparent surface protective member, the encapsulating layer is not often disposed between the transparent surface protective member and the transparent electrode layer.

The thin film solar cell element in the (2) aspect includes, for example, the transparent electrode layer/the pin-type silicon layer/a metal foil or a metal thin film layer (for example, a silver thin film layer) disposed on a heat-resistant macromolecular film in this order. Examples of the metal foil include a stainless steel foil and the like. Examples of the heat-resistant macromolecular film include a polyimide film and the like. The transparent electrode layer and the pin-type silicon layer are, similar to those in the (1) aspect, formed using the CVD method or the sputtering method. That is, the pin-type silicon layer is formed on the metal foil or the metal thin film layer disposed on the heat-resistant macromolecular film; and furthermore, the transparent electrode layer is formed on the pin-type silicon layer. In addition, the metal thin film layer disposed on the heat-resistant macromolecular film is also formed using the CVD method or the sputtering method.

In this case, the encapsulating layer is disposed between the transparent electrode layer and the transparent surface protective member; and between the metal foil or the heat-resistant macromolecular film and the back surface protective member respectively. As described above, the encapsulating layer obtained from the encapsulating material for solar cell is in contact with the collector line, the busbar for tab attachment, and the electrode such as the conductive layer of the solar cell element. In addition, compared with the crystalline silicon-based solar cell element, since the silicon layer is thinner in the thin film solar cell element in the (2) aspect, the silicon layer is not easily broken due to pressurization during the manufacturing of the solar cell module or the external impact during the operation of the module. Therefore, the flexibility of the encapsulating material for solar cell used for the thin film solar cell module may be lower than that of the encapsulating material for solar cell used for the crystalline silicon-based solar cell module. Meanwhile, since the electrode of the thin film solar cell element is a metal thin film layer as described above, in a case in which the electrode is deteriorated due to corrosion, there is a concern that the power generation efficiency may significantly decrease.

In addition, there is a solar cell module in which silicon is used for the solar cell element as another aspect of the solar cell module. Examples of the solar cell module in which silicon is used for the solar cell element include a hybrid-type (HIT-type) solar cell module in which crystalline silicon and amorphous silicon are laminated, a multi-junction-type (tandem-type) solar cell module in which silicon layers having different absorption wavelength ranges are laminated, aback contact-type solar cell module in which p-doped regions and n-doped regions are alternately provided on the back surface side which is provided on the opposite side to the light-incident surface of the solar cell element, a spherical silicon-type solar cell module in which a number of spherical silicon particles (having a diameter of approximately 1 mm) and a concave mirror (also serving as the electrode) which has a diameter in a range of 2 mm to 3 mm and improves the light-gathering capability are combined together, and the like. In addition, examples of the solar cell module in which silicon is used for the solar cell element include a field-effect-type solar cell module having a structure in which the role of an amorphous silicon-type p-type window layer having the pin junction structure of the related art is provided to the "inversion layer being induced by the field effect" instead of the "insulated transparent electrode", and the like. In addition, examples thereof include a GaAs-based solar cell module in which monocrystalline GaAs is used for the solar cell element; a CIS or CIGS-based (chalcopyrite-based) solar cell module in which a group compound called a chalcopyrite-based compound made of Cu, In, Ga, Al, Se, S or the like is used as the solar cell element instead of silicon; a CdTe—CdS-based solar cell in which a Cd compound thin film is used as the solar cell element, a $Cu_2ZnSnS_4$ (CZTS) solar cell module, and the like. The encapsulating material for solar cell of the embodiment can be used as an encapsulating material for solar cell for all of the above-described solar cell modules.

Particularly, the encapsulating material layer laminated below a photovoltaic element configuring the solar cell module is required to have adhesiveness to the encapsulating material layer, the electrode, and the back surface protective layer laminated on the top portion of the photovoltaic element. In addition, the encapsulating material layer is required to have thermal plasticity to hold the flatness of the back surface of the solar cell element as the photovoltaic element. Furthermore, the encapsulating material layer is required to have excellent scratch resistance, shock absorbance and the like to protect the solar cell element as the photovoltaic element.

The encapsulating material layer desirably has heat resistance. Particularly, when the solar cell module is manufactured, it is desirable that a resin composition configuring the encapsulating material layer not be modified and deteriorated or decomposed due to the heating action in a lamination method or the like in which the encapsulating material layer is suctioned in a vacuum, heated and pressurized or the action of heat such as sunlight during the long-term use of the solar cell module and the like. When the additives and the like contained in the resin composition are eluted or decomposed substances are generated, the elution of the additive and the generation of the decomposed substances act on the electromotive force surface (the element surface) of the solar cell element, and the function and performance of the solar cell element are deteriorated. Therefore, the heat resistance is an essential characteristic for the encapsulating material layer for solar cell module.

Furthermore, the encapsulating material layer preferably has an excellent moisture-proof property. In this case, it is possible to prevent moisture from transmitting from the back surface side of the solar cell module, and to prevent the corrosion and deterioration of the photovoltaic element in the solar cell module.

Unlike the filler layer laminated on the photovoltaic element, the above-described encapsulating material layer is not essentially required to have transparency. The encapsulating material for solar cell of the embodiment has the above-described characteristics, and can be preferably used as the encapsulating material for solar cell on the back surface side of the crystalline solar cell module and the encapsulating material for solar cell for the thin film-type solar cell module that is weak against moisture intrusion.

The solar cell module of the embodiment may appropriately include arbitrary members within the scope of the object of the invention. Typically, it is possible to provide an adhering layer, a shock absorbing layer, a coating layer, an anti-reflection layer, a back surface re-reflection layer, a light diffusion layer, and the like. The locations at which the above-described layers are provided are not particularly limited, and the layers can be provided at appropriate locations in consideration of the purpose of the provision of the layers and the characteristics of the layers.

(Transparent Surface Protective Member for Solar Cell Module)

There is no particular limitation with the transparent surface protective member for solar cell module used in the solar cell module, but the transparent surface protective member is located on the outermost surface layer of the solar cell module, and thus preferably has performances for ensuring long-term reliability for the outdoor exposure of the solar cell module including weather resistance, water repellency, contamination resistance, and mechanical strength. In addition, the transparent surface protective member is preferably a sheet having a small optical loss and high transparency for the effective use of sunlight.

Examples of a material for the transparent surface protective member for solar cell module include a resin film made of a polyester resin, a fluorine resin, an acryl resin, a cyclic olefin (co)polymer, an ethylene/vinyl acetate copolymer, or the like, a glass substrate, and the like. The resin film is preferably a polyester resin having excellent transparency, strength, cost, and the like, and particularly preferably a polyethylene terephthalate resin, a fluorine resin having favorable weather resistance, or the like. Examples of the fluorine resin include an ethylene/tetrafluoroethylene copolymer (ETFE), a polyvinyl fluoride resin (PVF), a polyvinylidene fluoride resin (PVDF), a polytetrafluoroethylene resin (PTFE), a fluorinated ethylene/propylene copolymer (FEP), and a poly trifluorochloroethylene resin (PCTFE). The polyvinylidene fluoride resin is excellent from the viewpoint of weather resistance, and the ethylene tetrafluoroethylene copolymer is excellent in terms of satisfying both weather resistance and mechanical strength. In addition, to improve the adhesiveness to materials configuring other layers such as an encapsulating material layer, it is desirable to carryout a corona treatment and a plasma treatment on the transparent surface protective member. In addition, it is also possible to use a sheet that has been subjected to a stretching treatment, for example, a biaxially stretched polypropylene sheet to improve the mechanical strength.

In a case in which a glass substrate is used as the transparent surface protective member for solar cell module, the total light transmittance of the glass substrate with respect to light having a wavelength in a range of 350 nm to 1400 nm is preferably equal to or more than 80%, and more preferably equal to or more than 90%. It is usual to use as the glass substrate a super white glass plate that only slightly absorbs the infrared region, but a blue glass plate has a small influence on the output characteristics of the solar cell module when the blue glass plate has a thickness of equal to or less than 3 mm. In addition, it is possible to obtain reinforced glass through a thermal treatment to increase the mechanical strength of the glass substrate, but a float glass plate that has not been subjected to a thermal treatment may be used. In addition, the light-incident surface side of the glass substrate may be coated for antireflection to suppress reflection.

(Back Surface Protective Member for Solar Cell Module)

There is no particular limitation with the back surface protective member for solar cell module used in the solar cell module, but the back surface protective member is located on the outermost surface layer of the solar cell module, and thus, similar to the above-described transparent surface protective member, is required to have a variety of characteristics such as weather resistance and mechanical strength. Therefore, the back surface protective member for solar cell module may be configured of the same material as for the transparent surface protective member. That is, a variety of the above-described materials used as the material for the transparent surface protective member can also be used as a material for the back surface protective member. Particularly, it is possible to preferably use a polyester resin and glass. Since the back surface protective member is not required to allow the penetration of sunlight, transparency required by the transparent surface protective member is not essentially required. Therefore, a reinforcement plate may be attached to increase the mechanical strength of the solar cell module or to prevent strain and warpage caused by the temperature change. Examples of the reinforcement plate that can be preferably used include a steel plate, a plastic plate, a fiberglass reinforced plastic (FRP) plate, and the like.

Furthermore, the encapsulating material for solar cell of the embodiment may be integrated with the back surface protective member for solar cell module. When the encapsulating material for solar cell and the back surface protective member for solar cell module are integrated together, it is possible to shorten a step for cutting the encapsulating material for solar cell and the back surface protective member for solar cell module to a module size when the module is assembled. In addition, when a step in which the encapsulating material for solar cell and the back surface protective member for solar cell module are separately laid up is replaced by a step in which the encapsulating material for solar cell and the back surface protective member for solar cell module are laid up as an integrated sheet, it is also possible to shorten and remove the lay-up step. In a case in which the encapsulating material for solar cell and the back surface protective member for solar cell module are integrated together, there is no particular limitation with the method for laminating the encapsulating material for solar cell and the back surface protective member for solar cell module. Preferable examples of the lamination method include a method in which the encapsulating material for solar cell and the back surface protective member are co-extruded using a well-known melt extruder such as a casting molder, an extrusion sheet molder, an inflation molder or an injection molder, thereby obtaining a laminate; and a method in which one layer is melted or laminated by heating on the other layer that has been previously molded, thereby obtaining a laminate.

In addition, the encapsulating material for solar cell and the back surface protective member may be laminated using a dry laminate method, a heat laminate method or the like in which an appropriate adhesive (for example, a maleic acid anhydride-modified polyolefin resin (product name "ADOMER (registered trademark)" manufactured by Mitsui Chemicals, Inc.), "MODIC (registered trademark)" manufactured by Mitsubishi Chemical Corporation or the like), a low (non) crystalline soft polymer such as an unsaturated polyolefin, an acrylic adhesive including an ethylene/acrylic acid ester/maleic acid anhydride-ternary copolymer (trade name "BONDINE (registered trademark)" manufactured by Sumika CdF Chemical Company Limited.), an ethylene/vinyl acetate-based copolymer, an adhesive resin composition containing what has been described above, or the like) is used.

An adhesive having heat resistance in a range of approximately 120° C. to 150° C. is preferably used as the adhesive, and preferable examples thereof include polyester-based adhesives, and polyurethane-based adhesives. In addition, to improve the adhesiveness between both surfaces, for example, a silane-based coupling treatment, a titanium-based coupling treatment, a corona treatment, a plasma treatment, or the like may be used in at least one layer.

(Solar Cell Element)

There is no particular limitation with the solar cell element used in the solar cell module as long as the solar cell element is capable of generating power using a photovoltaic effect of a semiconductor. As the solar cell element, for example, a silicon (monocrystalline silicon, polycrystalline silicon or non-crystalline (amorphous) silicon) solar cell, a compound semiconductor group, II-VI group, or the like) solar cell, a wet-type solar cell, an organic semiconductor solar cell, or the like can be used. Among the above-described solar cells, the polycrystalline silicon solar cell is preferred from the viewpoint of the balance between power generation performance and cost.

Both the silicon solar cell element and the compound semiconductor solar cell element have excellent characteristics as the solar cell element, but it is known that both solar cell elements are easily broken due to external stress, impact and the like. Since the encapsulating material for solar cell of the embodiment has excellent flexibility, the encapsulating material for solar cell has a great effect of absorbing the stress, impact and the like against the solar cell element so as to prevent the breakage of the solar cell element. Therefore, in the solar cell module of the embodiment, layers made of the encapsulating material for solar cell of the embodiment are desirably in direct contact with the solar cell element. In addition, when the encapsulating material for solar cell has thermal plasticity, it is possible to relatively easily remove the solar cell element even after the solar cell module has been produced, and the solar cell element obtains excellent recycling properties. Since the ethylene resin composition configuring the encapsulating material for solar cell of the embodiment has thermal plasticity, the encapsulating material for solar cell also has thermal plasticity as a whole, which is also preferable from the viewpoint of recycling properties.

(Electrode)

There is no particular limitation with the configuration and material of an electrode used in the solar cell module; however, in a specific example, the electrode has a laminate structure of a transparent conductive film and a metal film. The transparent conductive film is made of $SnO_2$, ITO, ZnO, or the like. The metal film is made of metal such as silver, gold, copper, tin, aluminum, cadmium, zinc, mercury, chromium, molybdenum, tungsten, nickel, or vanadium. The metal film may be solely used or may be used in a form of a complexed alloy. The transparent conductive film and the metal film are formed using a method such as CVD, sputtering, or deposition.

(Method for Manufacturing the Solar Cell Module)

A method for manufacturing the solar cell module of the embodiment includes (1) a step in which the transparent surface protective member, the encapsulating material for solar cell of the embodiment, the solar cell element (cell), the encapsulating material for solar cell, and the back surface protective member are laminated in this order, thereby forming a laminate, and (ii) a step in which the obtained laminate is pressurized and heated so as to be integrated.

In the step (i), a surface of the encapsulating material for solar cell on which an uneven shape (emboss shape) is formed is preferably disposed to be on the solar cell element side.

In the step (ii), the laminate obtained in the step (i) is heated and pressurized using a vacuum laminator or a hot press according to an ordinary method so as to be integrated (encapsulated). During the encapsulating, since the encapsulating material for solar cell of the embodiment has a high cushion property, it is possible to prevent the damage of the solar cell element. In addition, since the encapsulating material for solar cell of the embodiment has favorable deaeration properties, air is not trapped, and it is possible to manufacture high-quality products with a favorable yield.

When the solar cell module is manufactured, the ethylene/α-olefin-based resin composition configuring the encapsulating material for solar cell is cured through crosslinking. The crosslinking step may be carried out at the same time as the step (ii) or after the step (ii).

In a case in which the crosslinking step is carried out after the step (ii), the laminate is heated in a vacuum for three to six minutes under conditions of a temperature in a range of 125° C. to 160° C. and a vacuum pressure of equal to or less than 10 Torr in the step (ii); and then, pressurization by the atmospheric pressure is carried out for approximately 1 minute to 15 minutes, thereby integrating the laminate. The crosslinking step carried out after the step (ii) can be carried out using an ordinary method, and, for example, a tunnel-type continuous crosslinking furnace may be used, or a tray-type batch crosslinking furnace may be used. In addition, the crosslinking conditions are generally a temperature in a range of 130° C. to 155° C. for approximately 20 minutes to 60 minutes.

Meanwhile, in a case in which the crosslinking step is carried out at the same time as the step (ii), it is possible to carry out the crosslinking step in the same manner as the case in which the crosslinking step is carried out after the step (ii) except for the fact that the heating temperature in the step (ii) is set in a range of 145° C. to 170° C. and the pressurization time by the atmospheric pressure is set in a range of 6 minutes to 30 minutes. Since the encapsulating material for solar cell of the embodiment contains the specific organic peroxide so as to have excellent crosslinking characteristics, the solar cell module does not need to pass through two phases of an adhering step in the step (ii), is capable of being completed at a high temperature for a short period of time, the crosslinking step carried out after the step (ii) may be removed, and it is possible to significantly improve the productivity of the module.

In any case, the solar cell module of the embodiment may be manufactured by temporarily adhering the encapsulating material for solar cell to the solar cell element or a protection material at a temperature at which a crosslinking agent is not substantially decomposed and the encapsulating material for solar cell of the embodiment is melted, and then increasing the temperature, thereby carrying out sufficient adhering and the crosslinking of the encapsulating material. An additive prescription with which a variety of conditions can be satisfied may be selected, and, for example, the type and impregnation amount of the above-described crosslinking agent and the above-described crosslinking aid may be selected.

In addition, the above-described crosslinking is preferably carried out until the gel fraction of the crosslinked ethylene/α-olefin copolymer becomes 50% to 95%. The gel fraction is more preferably in a range of 50% to 90%, still more preferably in a range of 60% to 90%, and most preferably in a range of 65% to 90%. The gel fraction can be computed using the following method. For example, 1 g of a sample of an encapsulating material sheet is sampled from the solar cell module, and Soxhlet extraction is carried out for ten hours in boiling toluene. An extraction liquid is filtered using a stainless steel mesh having 30 meshes, and the mesh is depressurized and dried at 110° C. for eight hours. The weight of a residue remaining on the mesh is measured, and the ratio (%) of the weight of the residue remaining on the mesh to the sample amount (1 g) before the treatment is considered as the gel fraction.

When the gel fraction is equal to or more than the above-described lower limit value, the heat resistance of the encapsulating material for solar cell becomes favorable, and it is possible to suppress the degradation of the adhesiveness in, for example, a constant temperature and humidity test at 85° C.×85% RH, a high-strength xenon radiation test at a black panel temperature of 83° C., a heat cycle test at a temperature in a range of −40° C. to 90° C., and a heat resistance test. On the other hand, when the gel fraction is equal to or less than the above-described upper limit value, the encapsulating material for solar cell obtains high flexibility, and the temperature followability in the heat cycle test at a temperature in a range of −40° C. to 90° C. improves, and therefore it is possible to prevent the occurrence of peeling.

(Power Generation Facility)

The solar cell module of the embodiment is excellent in terms of productivity, power generation efficiency, service life, and the like. Therefore, a power generation facility using the above-described solar cell module is excellent in terms of cost, power generation efficiency, service life, and the like, and has a high practical value. The above-described power generation facility is preferable for long-term indoor and outdoor use so as to be used as an outdoor mobile power supply for camping and the like, which is installed outside houses, or to be used as an auxiliary power supply for automobile batteries.

EXAMPLES

Hereinafter, the invention will be specifically described based on examples, but the invention is not limited to the examples.

(1) Measurement Method

[The Content Ratio of the Ethylene Unit and the α-Olefin Unit]

After a solution obtained by heating and melting 0.35 g of a specimen in 2.0 ml of hexachlorobutadiene was filtered using a glass filter (G2), 0.5 ml of deuterated benzene was added, and the mixture was injected into an NMR tube having an inner diameter of 10 mm. The $^{13}$C-NMR was measured at 120° C. using a JNM GX-400-type NMR measurement device manufactured by JEOL, Ltd. The cumulated number was set to equal to or more than 8000 times. The content ratio of the ethylene unit and the content ratios of the α-olefin unit in the copolymer were determined from the obtained $^{13}$C-NMR spectra.

[MFR]

MFR of the ethylene/α-olefin copolymer was measured on the basis of ASTM D1238 under conditions of 190° C. and a load of 2.16 kg.

[Density]

The density of the ethylene/α-olefin copolymer was measured on the basis of ASTM D1505.

[Shore A Hardness]

After the ethylene/α-olefin copolymer was heated at 190° C. for four minutes and pressurized at 10 MPa, the ethylene/α-olefin copolymer was pressurized and cooled at 10 MPa to room temperature for five minutes, thereby obtaining a 3 mm-thick sheet. The shore A hardness of the ethylene/α-olefin copolymer was measured on the basis of ASTM D2240 using the obtained sheet.

[Heat Resistance]

A super white glass plate having no absorption region in a wavelength range of 350 nm to 800 nm was used, and a 500 μm-thick sheet sample was laminated on the super white glass plate using a lamination apparatus (LM-110×1605 manufactured by NPC Corporation) at 150° C. for three minutes in a vacuum and under pressurization for 15 minutes, thereby producing a laminate of the super white glass plate/the sheet sample. The obtained laminate sample was put into an oven at 130° C., and a heat resistance test was carried out for 500 hours. Evaluation was conducted by measuring the yellowness index (YI) of the sample before and after the test in a spectrophotometer (trade name "U-3010") manufactured by Hitachi, Ltd., and obtaining the ΔYI before and after the test. Meanwhile, the evaluation was conducted as described below.

A: ΔYI is equal to or less than 15
B: ΔYI is in a range of more than 15 to 25
C: ΔYI is more than 25

[Constant Temperature and Constant Humidity (DH)]

The sheet sample was sandwiched between super white glass plates having no absorption region in a wavelength range of 350 nm to 800 nm, and was treated under the same conditions as those for producing the sample for the above-described heat resistance test, thereby obtaining a laminate. An acceleration test was carried out on the obtained laminate on the basis of JIS C8917 using a custom-made XL75 (trade name) manufactured by Suga Test Instruments Co., Ltd. under the conditions of a temperature of 85° C. and a humidity of 85% in the test chamber for 400 hours.

The total light transmittance of the sheet sample in the above laminate was measured in the wavelength range of 350 nm to 800 nm using a spectrophotometer (trade name "U-3010") manufactured by Hitachi, Ltd. equipped with an integrating sphere of φ150 mm, with respect to the obtained acceleration test sample. In addition, the spectroscopic total light transmittance ($T_{vis}$) of visible light was computed by multiplying the standard light D65 and the standard luminous efficiency function V(λ) by the measurement result.

The difference in the transmittance of the obtained laminate at 450 nm before and after the test was evaluated.

A: the difference in transmittance is equal to or less than 5%

B: the difference in transmittance is in a range of more than 5% to 10%

C: the difference in transmittance is more than 10%

[Electrode Corrosion Properties]

The sheet sample was sandwiched between a blue reinforced glass plate having silver sputtered in the central portion and a super white glass plate having no absorption region in a wavelength range of 350 nm to 800 nm, and was treated under the same conditions as those for producing the sample for the above-described heat resistance test, thereby obtaining a laminate. An acceleration test was carried out on the obtained laminate on the basis of JIS C8917 using a custom-made XL75 (trade name) manufactured by Suga Test Instruments Co., Ltd. under the conditions of a temperature of 85° C. and a humidity of 85% in the test chamber for 2000 hours. LED light was made to strike the super white glass plate of the obtained acceleration test sample, and the state of the thin film electrode was visually observed from the blue glass plate side. Spotty corroded portions were observed in the sheet sample in which electrode corrosion occurred.

(2) the Synthesis of the Ethylene/α-Olefin Copolymer

Synthesis Example 1

A toluene solution of methyl aluminoxane was supplied as a co-catalyst at a rate of 8.0 mmol/hr, a hexane slurry of bis(1,3-dimethylcyclopentadienyl)zirconium dichloride and a hexane solution of triisobutylaluminum were supplied at rates of 0.025 mmol/hr and at 0.5 mmol/hr respectively as main catalysts to one supply opening of a continuous polymerization vessel having stirring blades and an inner volume of 50 L, and normal hexane which was used as a catalyst solution and polymerization solvent and was dehydrated and purified so that the total of the dehydrated and purified normal hexane became 20 L/hr was continuously supplied. At the same time, ethylene, 1-butene and hydrogen were continuously supplied at rates of 3 kg/hr, 15 kg/hr and 5 NL/hr respectively to another supply opening of the polymerization vessel, and continuous solution polymerization was carried out under conditions of a polymerization temperature of 90° C., a total pressure of 3 MPaG, and a retention time of 1.0 hour. The normal hexane/toluene solution mixture of the ethylene/α-olefin copolymer generated in the polymerization vessel was continuously exhausted through an exhaust opening provided in the bottom portion of the polymerization vessel, and was guided to a coupling pipe in which a jacket portion was heated using 3 kg/cm² to 25 kg/cm² steam so that the normal hexane/toluene solution mixture of the ethylene/α-olefin copolymer reached a temperature in a range of 150° C. to 190° C. Meanwhile, a supply opening through which methanol that was a catalyst-devitalizing agent was injected was provided immediately before the coupling pipe, and methanol was injected at a rate of approximately 0.75 L/hr so as to combine with the normal hexane/toluene solution mixture of the ethylene/α-olefin copolymer. The normal hexane/toluene solution mixture of the ethylene/α-olefin copolymer maintained at approximately 190° C. in the steam jacket-equipped coupling pipe was continuously sent to a flash chamber by adjusting the degree of the opening of a pressure control valve provided at the terminal portion of the coupling pipe so as to maintain approximately 4.3 MPaG. Meanwhile, when the normal hexane/toluene solution mixture was sent to the flash chamber, the solution temperature and the degree of the opening of the pressure-adjusting valve were set so that the pressure in the flash chamber was maintained at approximately 0.1 MPaG and the temperature of a vapor portion in the flash chamber was maintained at 180° C. After that, a strand was cooled in a water vessel after passing a single screw extruder in which the die temperature was set to 180° C., and the strand was cut using a pellet cutter, thereby obtaining an ethylene/α-olefin copolymer in a pellet form. The yield was 2.2 kg/hr. The properties are described in Table 1.

Synthesis Example 2

An ethylene/α-olefin copolymer was obtained in the same manner as in Synthesis Example 1 except for the fact that a hexane solution of [dimethyl(t-butylamide) (tetramethyl-η5-cyclopentadienyl)silane]titandichloride was supplied as a main catalyst at a rate of 0.012 mmol/hr, a toluene solution of triphenylcarbenium(tetrakis-pentafluorophenyl)borate and a hexane solution of triisobutylaluminum were supplied at rates of 0.05 mmol/hr and 0.4 mmol/hr respectively as co-catalysts, and 1-butene and hydrogen were supplied at rates of 5 kg/hr and 100 NL/hr respectively. The yield was 1.3 kg/hr. The properties are described in Table 1.

Synthesis Example 3

An ethylene/α-olefin copolymer was obtained in the same manner as in Synthesis Example 1 except for the fact that a hexane solution of bis(p-tolyl)methylene(cyclopentadienyl) (1,1,4,4,7,7,10,10-octamethyl-1,2,3,4,7,8,9,10-octahydrodibenzo(b,h)-fluorenyl)zirconium dichloride was supplied as a main catalyst at a rate of 0.003 mmol/hr; a toluene solution of methyl aluminoxane and a hexane solution of triisobutylaluminum were supplied at rates of 3.0 mmol/hr and 0.6 mmol/hr respectively as co-catalysts; ethylene was supplied at a rate of 4.3 kg/hr; 1-octene was supplied instead of 1-butene at a rate of 6.4 kg/hr; dehydrated and purified normal hexane was continuously supplied so that the total of 1-octane and the dehydrated and purified normal hexane which was used as a catalyst solution and a polymerization solvent became 20 L/hr; hydrogen was supplied at a rate of 40 NL/hr; and the polymerization temperature was set to 130° C. The yield was 4.3 kg/hr. The properties are described in Table 1.

TABLE 1

| | Synthesis Example 1 | Synthesis Example 2 | Synthesis Example 3 |
|---|---|---|---|
| α-olefin type | 1-butene | 1-butene | 1-octene |
| Content ratio of α-olefin unit [mol %] | 14 | 17 | 11 |
| Content ratio of ethylene unit [mol %] | 86 | 83 | 89 |
| MFR [g/10 minutes] | 20 | 11 | 48 |
| Shore A hardness [—] | 70 | 62 | 84 |
| Density [g/cm³] | 0.870 | 0.866 | 0.884 |

(3) Manufacturing of the Encapsulating Material for Solar Cell (Sheet)

Example 1

0.5 parts by weight of 3-methacryloxypropyltrimethoxy silane as the silane coupling agent, 1.0 part by weight of t-butylperoxy-2-ethylhexyl carbonate having a one-minute half-life temperature of 166° C. as the organic peroxide, 1.2 parts by weight of triallyl isocyanurate as the crosslinking aid, 0.4 parts by weight of 2-hydroxy-4-normal-octyloxybenzophenone as the ultraviolet absorber, 0.2 parts by weight of bis(2,2,6,6-tetramethyl-4-piperidyl)sebacate as the hindered amine-based light stabilizer, 0.02 parts by weight of octadecyl-3-(3,5-di-tert-butyl-4-hydroxyphenyl) propionate as the hindered phenol-based stabilizer, and 0.07 parts by weight of tris(2,4-di-tert-butylphenyl)phosphite as the phosphorous-based stabilizer were blended with 100 parts by weight of the ethylene/α-olefin copolymer of Synthetic Example 1.

A coat hanger T die (with a lip shape: 270 mm×0.8 mm) was mounted in a single screw extruder (with a screw diameter of 20 mmφ, L/D=28) manufactured by Thermoplastic Company, and molding was carried out at a roll temperature of 30° C. and a winding rate of 1.0 m/min under a condition of a die temperature of 100° C. using an embossing roll as a cooling roll, thereby obtaining an embossed sheet (a sheet of the encapsulating material for solar cell) having a maximum thickness of 500 μm. The porosity of the obtained sheet was 28%. A variety of evaluation results of the obtained sheet are described in Table 2.

Examples 2 to 4

Embossed sheets (sheets of the encapsulating material for solar cell) were obtained in the same manner as in Example 1 except for the fact that the components were blended as described in Table 2. The porosities of the obtained sheets were all 28%. A variety of evaluation results of the obtained sheets are described in Table 2.

Comparative Examples 1 to 4

Embossed sheets (sheets of the encapsulating material for solar cell) were obtained in the same manner as in Example 1 except for the fact that the components were blended as described in Table 2. The porosities of the obtained sheets were all 28%. A variety of evaluation results of the obtained sheets are described in Table 2.

Comparative Example 5

An embossed sheet (a sheet of the encapsulating material for solar cell) was obtained in the same manner as in Example 1 except for the fact that 6-[3-(3-t-butyl-4-hydroxy-5-methyl)propoxy]-2,4,8,10-tetra-t-butyldibenz[d,t][1,3,2]-dioxaphosphepine was used and blended as described in Table 2 as the stabilizer having a phosphite ester structure and a hindered phenol structure in the same molecule instead of the hindered phenol-based stabilizer and the phosphorous-based stabilizer of Example 1. The porosity of the obtained sheet was 28%. However, a gel was observed at approximately three points per square meter in the obtained sheet, and the sheet did not have a favorable appearance. A variety of evaluation results of the obtained sheets are described in Table 2.

TABLE 2

| | Example 1 | Example 2 | Example 3 | Example 4 | Comparative Example 1 | Comparative Example 2 | Comparative Example 3 | Comparative Example 4 | Comparative Example 5 |
|---|---|---|---|---|---|---|---|---|---|
| Blending (parts by weight) Ethylene/α-olefin copolymer | | | | | | | | | |
| Synthetic Example 1 | 100 | | | | | | | | |
| Synthetic Example 2 | | 100 | | 100 | 100 | | | | |
| Synthetic Example 3 | | | 100 | | | 100 | 100 | 100 | 100 |
| Silane coupling agent | 0.5 | 0.5 | 0.5 | 0.5 | 0.5 | 0.5 | 0.5 | 0.5 | 0.5 |
| Organic peroxide | 1.0 | 1.0 | 1.0 | 1.0 | 1.0 | 1.0 | 1.0 | 1.0 | 1.0 |
| Crosslinking aid | 1.2 | 1.2 | 1.2 | 1.2 | 1.2 | 1.2 | 1.2 | 1.2 | 1.2 |
| Ultraviolet absorber | 0.4 | 0.4 | 0.4 | 0.4 | 0.4 | 0.4 | 0.4 | 0.4 | 0.4 |
| Hindered amine-based light stabilizer | 0.2 | 0.2 | 0.2 | 0.2 | 0.2 | 0.2 | 0.2 | 0.2 | 0.2 |
| Hindered phenol-based stabilizer | 0.02 | 0.01 | 0.1 | 0.07 | 0.05 | | 0.2 | | |
| Phosphorous-based stabilizer | 0.07 | 0.4 | 0.01 | 0.1 | | 0.05 | | 0.6 | |
| Stabilizer having phosphite ester structure and hindered phenol structure in the same molecule | | | | | | | | | 0.05 |
| Evaluation | | | | | | | | | |
| ΔYI after 130° C. × 500 hr | A | B | A | A | B | C | A | C | B |
| Transmittance at 450 mm after DH test | A | A | B | B | B | A | C | A | A |
| Appearance of molded sheet | Favorable | Favorable | Favorable | Favorable | Favorable | Favorable | Favorable | Favorable | Gel included |
| Electrode corrosion properties | No corrosion | No corrosion | No corrosion | No corrosion | No corrosion | No corrosion | No corrosion | Slightly corroded | No corrosion |

The present application claims priority based on Japanese Patent Application No. 2012-029619 filed on Feb. 14, 2012, and the contents of which are incorporated herein by reference.

The invention claimed is:

1. A solar cell module comprising:
   a transparent surface protective member;
   a back surface protective member;

a solar cell element; and an encapsulating layer which is formed by crosslinking an encapsulating material for solar cell and encapsulates the solar cell element between the transparent surface protective member and the back surface protective member, wherein the encapsulating material for solar cell comprises an ethylene/α-olefin copolymer, a hindered amine-based light stabilizer, a hindered phenol-based stabilizer, and a phosphorous-based stabilizer, a content of the hindered phenol-based stabilizer in the encapsulating material for solar cell is in a range of 0.01 parts by weight to 0.06 parts by weight with respect to 100 parts by weight of the ethylene/α-olefin copolymer, a content of the phosphorous-based stabilizer in the encapsulating material for solar cell is in a range of 0.02 parts by weight to 0.2 parts by weight with respect to 100 parts by weight of the ethylene/α-olefin copolymer, wherein the hindered phenol-based stabilizer includes octadecyl-3-(3,5-di-t-butyl-4-hydroxphenyl)propionic acid ester, and the phosphorous-based stabilizer includes tris(2,4-di-tert-butylphenyl)phosphite.

2. The solar cell module according to claim 1,
wherein a content of the hindered amine-based light stabilizer in the encapsulating material for solar cell is in a range of 0.01 parts by weight to 2.0 parts by weight with respect to 100 parts by weight of the ethylene/α-olefin copolymer.

3. The solar cell module according to claim 1,
wherein the encapsulating material for solar cell further comprises an organic peroxide.

4. The solar cell module according to claim 3,
wherein a one-minute half-life temperature of the organic peroxide is in a range of 100° C. to 170° C., and
a content of the organic peroxide in the encapsulating material for solar cell is in a range of 0.1 parts by weight to 3 parts by weight with respect to 100 parts by weight of the ethylene/α-olefin copolymer.

5. The solar cell module according to claim 1,
wherein the ethylene/α-olefin copolymer satisfies the following requirements a1) to a4):
a1) a content ratio of a structural unit derived from ethylene is in a range of 80 mol % to 90 mol %, and a content ratio of a structural unit derived from an α-olefin having 3 to 20 carbon atoms is in a range of 10 mol % to 20 mol %;
a2) MFR, which is based on ASTM D1238 and measured under conditions of a temperature of 190° C. and a load of 2.16 kg, is in a range of 10 g/10 minutes to 50 g/10 minutes;
a3) a density, which is measured on the basis of ASTM D1505, is in a range of 0.865 g/cm$^3$ to 0.884 g/cm$^3$; and
a4) a shore A hardness, which is measured on the basis of ASTM D2240, is in a range of 60 to 85.

6. The solar cell module according to claim 1,
wherein the encapsulating material for solar cell further comprises a silane coupling agent, and
a content of the silane coupling agent in the encapsulating material for solar cell is in a range of 0.1 parts by weight to 5 parts by weight with respect to 100 parts by weight of the ethylene/α-olefin copolymer.

7. The solar cell module according to claim 1,
wherein the encapsulating material for solar cell further comprises an ultraviolet absorber, and
a content of the ultraviolet absorber in the encapsulating material for solar cell is in a range of 0.005 parts by weight to 5 parts by weight with respect to 100 parts by weight of the ethylene/α-olefin copolymer.

8. The solar cell module according to claim 1,
wherein the encapsulating material for solar cell further comprises a crosslinking aid, and
a content of the crosslinking aid in the encapsulating material for solar cell is in a range of 0.05 parts by weight to 5 parts by weight with respect to 100 parts by weight of the ethylene/α-olefin copolymer.

9. The solar cell module according to claim 1,
wherein the encapsulating material for solar cell is obtained by melting and kneading the ethylene/α-olefin copolymer, the hindered amine-based light stabilizer, the hindered phenol-based stabilizer, and the phosphorous-based stabilizer, and then molding by extrusion the mixture into a sheet shape.

10. The solar cell module according to claim 1,
wherein the encapsulating material for solar cell has a sheet shape.

11. The solar cell module according to claim 1,
wherein the hindered amine-based light stabilizer includes bis(2,2,6,6-tetramethyl-4-piperidyl)sebacate.

* * * * *

UNITED STATES PATENT AND TRADEMARK OFFICE
CERTIFICATE OF CORRECTION

PATENT NO. : 9,543,461 B2  
APPLICATION NO. : 14/378462  
DATED : January 10, 2017  
INVENTOR(S) : Shigenobu Ikenaga et al.

Page 1 of 1

It is certified that error appears in the above-identified patent and that said Letters Patent is hereby corrected as shown below:

On the Title Page

Item (73) Assignee: change "MITSUI CHEMICALS, INC., Tokyo (JP)" to --Mitsui Chemicals Tohcello, Inc., Tokyo (JP)--

Signed and Sealed this  
Third Day of April, 2018

Andrei Iancu  
*Director of the United States Patent and Trademark Office*